United States Patent
Lee et al.

(10) Patent No.: US 10,846,174 B2
(45) Date of Patent: Nov. 24, 2020

(54) METHOD OF RECOVERING DATA AND MEMORY SYSTEM AND RAID STORAGE SYSTEM USING THE SAME

(71) Applicant: SAMSUNG ELECTRONICS CO., LTD., Suwon-si (KR)

(72) Inventors: Myung-Kyu Lee, Seoul (KR); Geun-Yeong Yu, Seongnam-si (KR); Dong-Min Shin, Seoul (KR); Jong-Ha Kim, Seongnam-si (KR); Jun-Jin Kong, Yongin-si (KR); Beom-Kyu Shin, Seongnam-si (KR); Ji-Youp Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 229 days.

(21) Appl. No.: 15/613,718

(22) Filed: Jun. 5, 2017

(65) Prior Publication Data
US 2018/0004601 A1    Jan. 4, 2018

(30) Foreign Application Priority Data
Jun. 30, 2016    (KR) .................. 10-2016-0082977

(51) Int. Cl.
*H03M 13/00*    (2006.01)
*G06F 11/10*    (2006.01)
*H03M 13/27*    (2006.01)
*H03M 13/45*    (2006.01)
*H03M 13/29*    (2006.01)
(Continued)

(52) U.S. Cl.
CPC ..... *G06F 11/1076* (2013.01); *H03M 13/2707* (2013.01); *H03M 13/45* (2013.01); *H03M 13/616* (2013.01); *H03M 13/1102* (2013.01); *H03M 13/152* (2013.01); *H03M 13/1515* (2013.01); *H03M 13/2957* (2013.01)

(58) Field of Classification Search
CPC .......... H04N 7/26; H04N 13/00; H04N 19/51; H04N 19/597; H04N 7/32; G06F 11/10; G06F 11/1076; G06F 17/30; G06F 3/06; H03M 13/1102; H03M 13/00; H03M 13/1515; H03M 13/152; H03M 13/2707; H03M 13/2957; H03M 13/45; H03M 13/616
See application file for complete search history.

(56) References Cited

U.S. PATENT DOCUMENTS 5,357,471 A * 10/1994 Alapat .................. G11C 29/02
                                                        365/189.15
5,684,810 A    11/1997 Nakamura et al.
6,526,531 B1    2/2003 Wang
(Continued)

*Primary Examiner* — Albert Decady
*Assistant Examiner* — Enamul M Kabir
(74) *Attorney, Agent, or Firm* — Volentine, Whitt & Francos, PLLC

(57) ABSTRACT

A method and system of recovering data includes reading reference codewords, which have code correlation with a target codeword, from a memory device when an error-correcting code (ECC) decoding process for a decoder input of the target codeword has failed. A decoder input of a corrected target codeword is generated based on an operation process using the target codeword and the reference codewords. An ECC decoding process is performed again on the decoder input of the corrected target codeword.

20 Claims, 28 Drawing Sheets

(51) Int. Cl.
   *H03M 13/11* (2006.01)
   *H03M 13/15* (2006.01)

(56) References Cited

U.S. PATENT DOCUMENTS

| | | | |
|---|---|---|---|
| 6,865,708 B2 | 3/2005 | Wang | |
| 8,046,660 B2 * | 10/2011 | Wu | G11C 29/52 |
| | | | 714/755 |
| 8,468,430 B2 * | 6/2013 | Shin | H03M 13/2927 |
| | | | 714/755 |
| 8,671,326 B1 * | 3/2014 | Tang | H03M 13/1102 |
| | | | 714/758 |
| 8,850,296 B2 * | 9/2014 | Weingarten | G06F 11/1068 |
| | | | 714/781 |
| 8,869,000 B2 | 10/2014 | Varnica et al. | |
| 8,954,831 B2 * | 2/2015 | Anholt | G06F 11/1012 |
| | | | 714/752 |
| 9,043,681 B2 * | 5/2015 | Kalavade | H03M 13/1102 |
| | | | 714/774 |
| 9,053,047 B2 | 6/2015 | Sommer et al. | |
| 2002/0147954 A1 * | 10/2002 | Shea | H03M 13/098 |
| | | | 714/755 |
| 2014/0153625 A1 * | 6/2014 | Vojcic | H03M 13/451 |
| | | | 375/224 |
| 2016/0350186 A1 * | 12/2016 | Blaum | H03M 13/373 |

\* cited by examiner

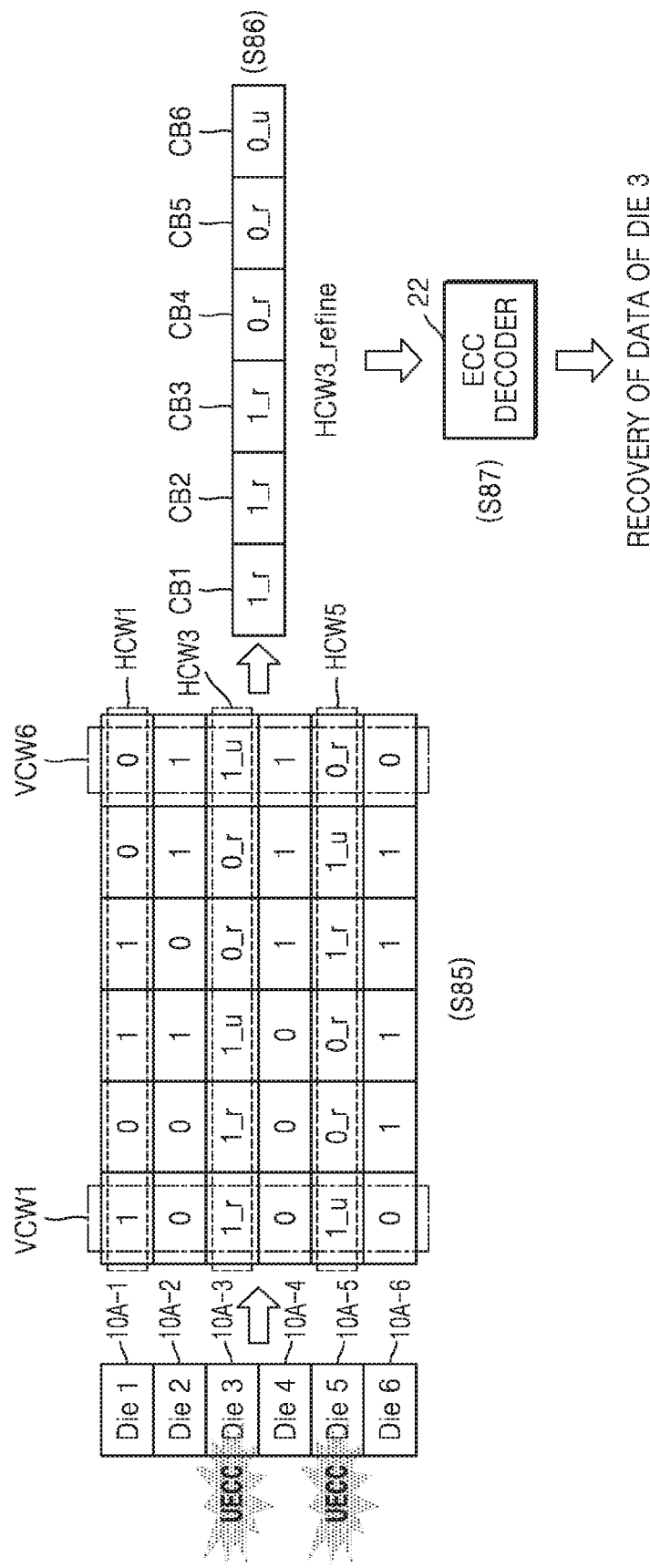

METHOD OF RECOVERING DATA AND MEMORY SYSTEM AND RAID STORAGE SYSTEM USING THE SAME

CROSS-REFERENCE TO RELATED APPLICATION

This application claims the benefit of Korean Patent Application No. 10-2016-0082977, filed on Jun. 30, 2016, in the Korean Intellectual Property Office, the disclosure of which is incorporated herein in its entirety by reference.

BACKGROUND

The disclosure relates to a method of processing data and a data processing device, and more particularly, to a method of recovering data and a memory system and a redundant array of inexpensive disks (RAID) storage system, which use the method of recovering data.

In data storage technical fields, a very low bit error rate is required to provide reliability to information transmission or storage. A turbo code or a low density parity check (LDPC) code is used for error correction. However, in a data storage device in which memory density is high, it is difficult to achieve a very low bit error rate that is required by a system, although the turbo code or the LDPC code is used. Thus, an effective data recovery technique is needed.

SUMMARY

The disclosure describes a method of efficiently recovering a target codeword by using codewords having code correlation.

The disclosure describes a memory system for efficiently recovering a target codeword by using codewords having code correlation.

The disclosure also describes a redundant array of inexpensive disks (RAID) storage system for efficiently recovering a target codeword by using codewords having code correlation.

According to an aspect of the disclosure, there is provided a method of recovering data, the method including: reading reference codewords, which have code correlation with a target codeword, from a memory device when an error-correcting code (ECC) decoding process for a decoder input of the target codeword has failed; generating a decoder input of a corrected target codeword, based on an operation process using the target codeword and the reference codewords; and performing the ECC decoding process again on the decoder input of the corrected target codeword.

According to another aspect of the disclosure, there is provided a memory system including a memory device configured to store data and a memory controller configured to recover a target codeword based on data read from the memory device. The memory controller: (1) reads reference codewords, which have code correlation with the target codeword, from the memory device when an ECC decoding process for an input of the target codeword fails, (2) generates a decoder input of a corrected target codeword, based on an operation process using the target codeword and the reference codewords, and (3) performs the ECC decoding process again on the decoder input of the corrected target codeword.

According to another aspect of the disclosure, there is provided a redundant array of inexpensive disks (RAID) storage system including a plurality of storage devices and a RAID controller. The RAID controller: (1) corrects a soft input of a codeword that has failed in an ECC decoding process, based on an operation process according to a code correlation by using soft inputs received from storage devices that have failed in an ECC decoding process, and (2) decodes results received from storage devices that have succeeded in the ECC decoding process, when the ECC decoding process for codewords read from two or more storage devices forming the same stripe from among the plurality of storage devices fails. Additionally, the RAID controller performs the ECC decoding process on the corrected soft input of the codeword.

According to another aspect of the disclosure, there is provided a memory system having a nonvolatile memory system and a memory controller. The memory controller: (1) executes a soft read of a target code word stored by the nonvolatile memory system that cannot be properly decoded by applying error-correction code (ECC) decoding, (2) executes a soft read of a first reference code word stored by the nonvolatile memory system that cannot be properly decoded by applying the ECC decoding, (3) identifies a candidate code word that does not satisfy a code constraint, the candidate code word comprising data from each of the soft read of the target code word, the soft read of the first reference code word, and a second reference code word that can be properly decoded by applying the ECC decoding, (4) changing a data value attributed to a data unit within the soft read of the target code word, so that the candidate code word satisfies the code constraint, and thereby creating a revised soft read of the target code word, and (5) applying the ECC decoding to the revised soft read of the target code word.

BRIEF DESCRIPTION OF THE DRAWINGS

Embodiments of the disclosure will be more clearly understood from the following detailed description taken in conjunction with the accompanying drawings in which:

FIGS. 22A and 22B are diagrams showing other examples of performing a data recovery process in the memory system of FIG. 1;

DETAILED DESCRIPTION OF THE EMBODIMENTS

Figure 1:
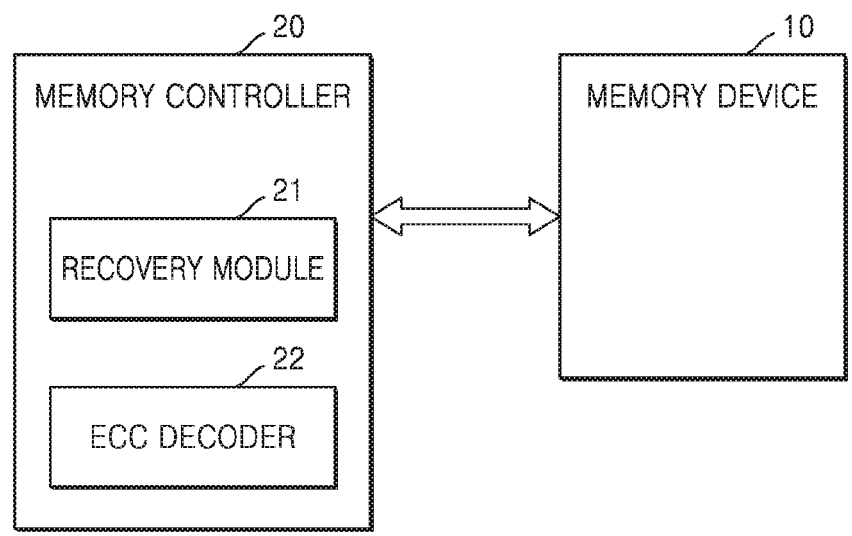
FIG. 1 is a block diagram of a memory system according to an embodiment.

Hereinafter, embodiments of the disclosure will be described with reference to the attached drawings. Like reference numerals in the drawings denote like elements.

FIG. 1 is a block diagram of a memory system 100 according to an embodiment.

Referring to FIG. 1, the memory system 100 includes a memory device 10 and a memory controller 20.

The memory device 10 may be implemented with a non-volatile memory device. For example, the memory device 10 may include a flash memory device, a phase change random access memory (PRAM) device, a ferroelectric RAM (FRAM) device, and/or a magnetic RAM (MRAM) device. The memory device 10 may have a form in which at least one non-volatile memory device and at least one volatile memory device are combined together, and may have a form in which at least two types of non-volatile memory devices are combined together.

For example, the memory device 10 may include a single memory chip. As another example, the memory device 10 may include a plurality of memory chips. The single memory chip may include a single die or a plurality of dies. The single die may include a single plane or a plurality of planes. The single plane may include a plurality of memory blocks, each of the memory blocks may include a plurality of pages, and each of the pages may include a plurality of sectors.

The memory controller 20 controls the memory device 10. For example, the memory controller 20 may generate an address ADDR, a command CMD, and a control signal CTRL to control the memory device 10. The memory controller 20 may control program (or write), read, and erase operations of the memory device 10 by providing the address ADDR, the command CMD, and the control signal CTRL to the memory device 10.

The memory controller 20 may also generate a control signal that is used to execute a hard decision read operation or soft decision read operation of the memory device 10.

For example, the memory controller 20 may configure a stripe by using a plurality of memory chips included in the memory device 10. As another example, the memory controller 20 may configure a stripe by using a plurality of dies included in the memory device 10. As another example, the memory controller 20 may configure a stripe by using a plurality of planes included in the memory device 10. As another example, the memory controller 20 may configure a stripe based on a plurality of blocks, a plurality of pages, or a plurality of sectors included in the memory device 10.

For example, a stripe may be configured with memory blocks, pages, or sectors, which include memory cells belonging to different planes in a three-dimensional vertical NAND (VNAND) flash memory cell structure of the memory device 10. As another example, a stripe may be configured with memory blocks, pages, or sectors, which include memory cells belonging to the same plane in a three-dimensional VNAND flash memory cell structure of the memory device 10.

The memory controller 20 may generate a multi-dimensional code based on data read from the memory device 10 in stripe units. For example, a stripe according to a redundant array of inexpensive disks (RAID) method may be used.

The memory controller 20 includes a recovery module 21 and an error-correcting code (ECC) decoder 22.

The ECC decoder 22 performs an error detection and correction process on data read from the memory device 10. For example, an error correction process may be performed by using a low density parity check (LDPC) code, a Bose-Chaudhuri-Hocquenghem (BCH) code, a turbo code, and a convolution code.

When an ECC decoding process for a target codeword, performed in the ECC decoder 22, fails, the recovery module 21 performs an operation process of generating a corrected target codeword to recover data that has failed in the ECC decoding process. Here, the target codeword is a codeword in ECC decoding process units, which forms data that a host (not shown) requested to be read.

For example, when an ECC decoding process for a target codeword, performed in the ECC decoder 22, fails, the recovery module 21 may generate a corrected target codeword based an operation process that uses reference codewords, which have code correlation with the target codeword, and a target codeword that has failed in an ECC decoding process. For example, the reference codewords may include codewords read from a storage region of the memory device 10, which forms the same stripe as the target codeword. The ECC decoder 22 performs an ECC decoding process for error detection and correction on a reference codeword read from the memory device 10.

For example, the recovery module 21 may generate a corrected decoder input for a target codeword, based on an operation process according to code correlation, by using a decoding result of a reference codeword that has succeeded in an ECC decoding process, a soft input of a reference codeword that has failed in an ECC decoding process, and a soft input of a target codeword that has failed in an ECC decoding process. The soft input includes code bit information that includes a sign bit and a reliability bit in memory cell units, read from the memory device 10 according to a soft decision read operation.

When an ECC decoding process for at least one of reference codewords, performed in the ECC decoder 22, fails, the recovery module 21 detects a candidate codeword, which does not satisfy a code constraint condition, from a code matrix including a decoding result of a reference codeword, a soft input of a reference codeword, and a soft input of a target codeword, and performs an operation process of correcting a decoder input of the target codeword, based on reliability of code bits included in the candidate codeword.

When an ECC decoding process for a target codeword fails, the ECC decoder 22 may perform an ECC decoding process again on a corrected target word, which is input from the recovery module 21, in order to recover the target codeword.

Figure 2:
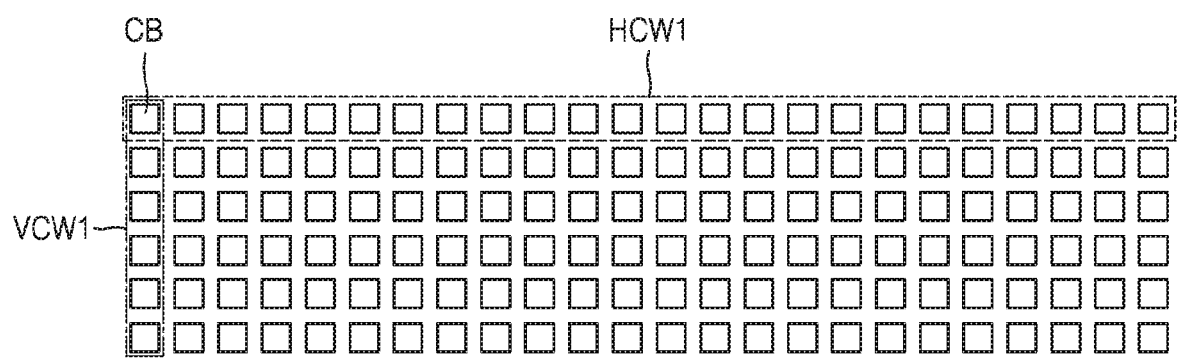
FIG. 2 is a diagram showing a code matrix structure of a multi-dimensional code according to an embodiment.

FIG. 2 is a diagram showing a code matrix structure of a multi-dimensional code according to an embodiment.

The multi-dimensional code denotes a code in which a code matrix may be configured in a multi-dimensional form. For example, the multi-dimensional code may include a product code. The code matrix of the multi-dimensional code may include codewords in two directions. For example, a code matrix of the multi-dimensional code may include codewords read from storage regions of the memory device 10, which form a stripe.

Referring to FIG. 2, the code matrix of the multi-dimensional code includes a plurality of horizontal codewords and a plurality of vertical codewords. For example, a first horizontal codeword of the plurality of horizontal codewords is indicated by 'HCW1', and a first vertical codeword of the plurality of vertical codewords is indicated by 'VCW1'. Each of the horizontal codewords and each of the vertical codewords include a plurality of code bits CB.

For example, an ECC, such as an LDPC code, a BCH code, a turbo code, and a convolution code, may be used as a horizontal code, and a bit-wise XOR code that is applied to a RAID-5 may be used as a vertical codeword. As another example, a Reed-Solomon code that is applied to a RAID-6 may be used as a vertical codeword.

FIGS. 3A to 3F are diagram showing various examples in which a stripe is configured in the memory system 100 of FIG. 1.

Figure 3A:
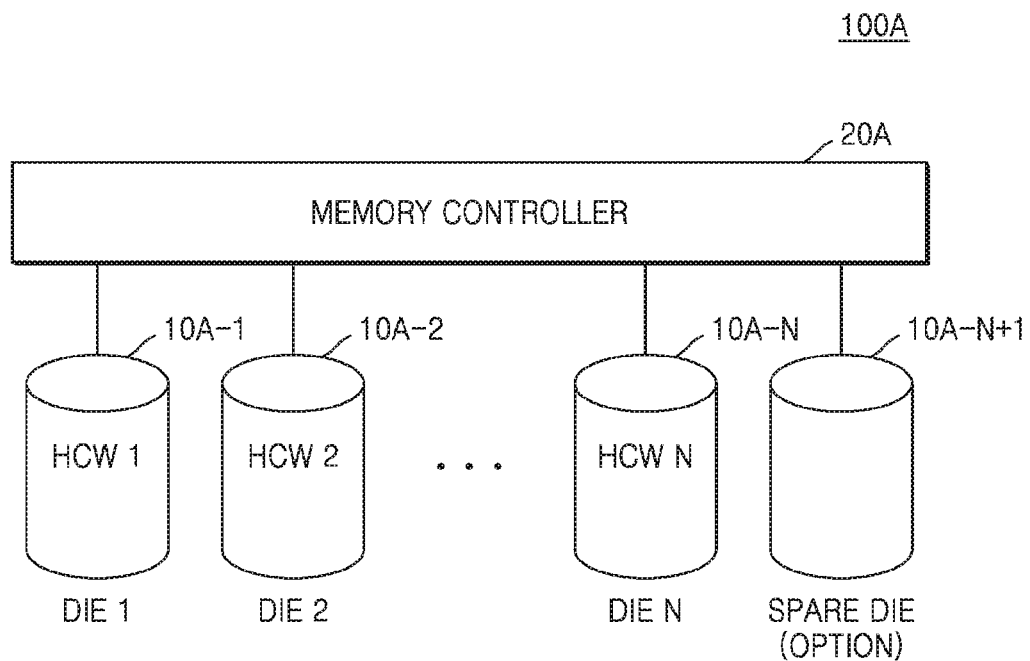
FIG. 3A is a diagram showing an example in which a stripe is configured in the memory system of FIG. 1.

FIG. 3A is a diagram showing an example in which a stripe is configured with dies included in the memory device 10. The memory device 10 may include a plurality of dies 10A-1 to 10A-N+1. For example, a stripe may include N dies 10A-1 to 10A-N (where N is an integer that is equal to or greater than 2), and one die 10A-N+1 may be assigned as a spare die. For example, the spare die 10A-N+1 may be used to store data recovered after an ECC decoding process in the dies 10A-1 to 10A-N of the stripe fails. As another example, data recovered after an ECC decoding process in the dies 10A-1 to 10A-N of the stripe fails may be stored in a physical address of any one of the dies 10A-1 to 10A-N instead of using the spare die 10A-N+1.

A memory controller 20A (corresponding to the memory controller 20) of a memory system 100A (corresponding to the memory system 100) may read codewords HCW1 to HCWN dividedly stored in the dies 10A-1 to 10A-N of the stripe and generate a code matrix of a multi-dimensional code, as shown in FIG. 2. For example, horizontal codewords HCW1 to HCWN of a code matrix of a multi-dimensional code may be generated by using the codewords HCW1 to HCWN read from the dies 10A-1 to 10A-N.

Figure 3B:
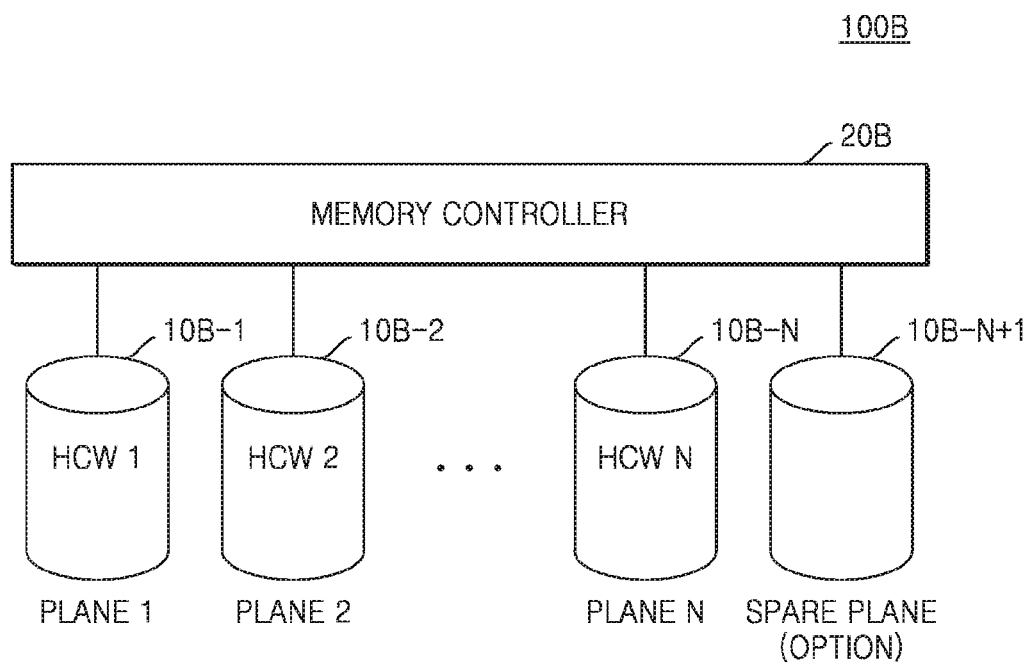
FIG. 3B is a diagram showing another example in which a stripe is configured in the memory system of FIG. 1.

FIG. 3B is a diagram showing an example in which a stripe is configured with planes included in the memory device 10. The memory device 10 may include a plurality of planes 10B-1 to 10B-N+1. For example, a stripe may include N planes 10B-1 to 10B-N (where N is an integer that is equal to or greater than 2), and one plane 10B-N+1 may be assigned as a spare plane. For example, the spare plane 10B-N+1 may be used to store data recovered after an ECC decoding process in the planes 10B-1 to 10B-N of the stripe fails. As another example, data recovered after an ECC decoding process in the planes 10B-1 to 10B-N of the stripe fails may be stored in a physical address of any one of the planes 10B-1 to 10B-N instead of using the spare plane 10B-N+1.

A memory controller 20B (corresponding to the memory controller 20) of a memory system 100B (corresponding to the memory system 100) may read codewords HCW1 to HCWN dividedly stored in the planes 10B-1 to 10B-N of the stripe and generate a code matrix of a multi-dimensional code, as shown in FIG. 2. For example, horizontal codewords HCW1 to HCWN of a code matrix of a multi-dimensional code may be generated by using the codewords HCW1 to HCWN read from the planes 10B-1 to 10B-N.

Figure 3C:
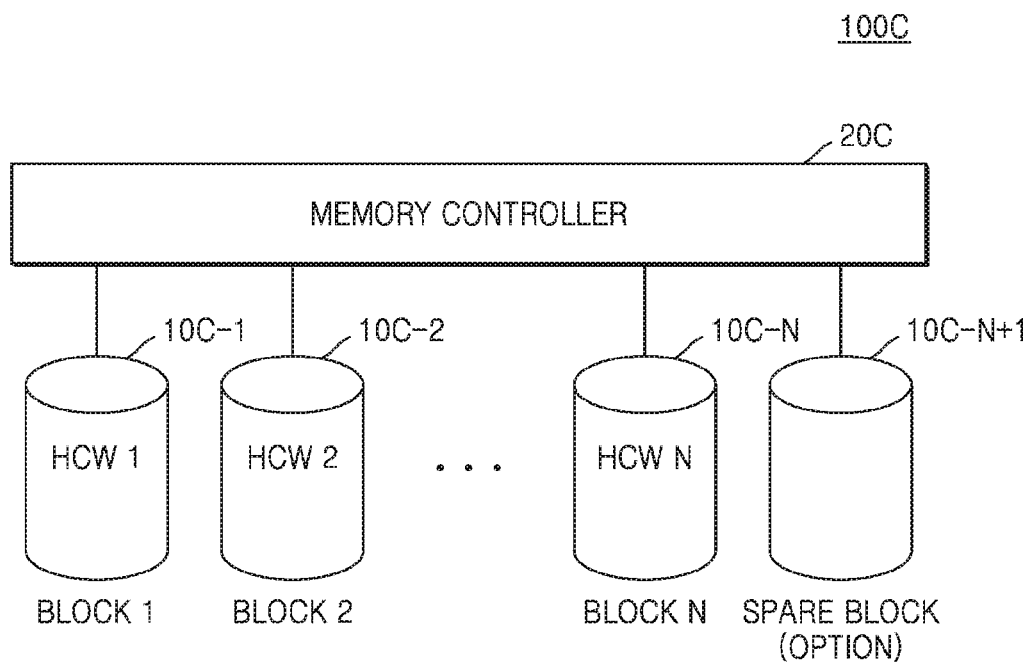
FIG. 3C is a diagram showing another example in which a stripe is configured in the memory system of FIG. 1.

FIG. 3C is a diagram showing an example in which a stripe is configured with memory blocks included in the memory device 10. The memory device 10 may include a plurality of memory blocks 10C-1 to 10C-N+1. For example, a stripe may include N memory blocks 10C-1 to 10C-N (where N is an integer that is equal to or greater than 2), and at least one memory block 10C-N+1 may be assigned as a spare block. For example, the spare block 10C-N+1 may be used to store data recovered after an ECC decoding process in the memory blocks 10C-1 to 10C-N of the stripe fails. As another example, data recovered after an ECC decoding process in the memory blocks 10C-1 to 10C-N of the stripe fails may be stored in a physical address of any one of the memory blocks 10C-1 to 10C-N instead of using the spare memory block 10C-N+1.

A memory controller 20C (corresponding to the memory controller 20) of a memory system 100C (corresponding to the memory system 100) may read codewords HCW1 to HCWN dividedly stored in the memory blocks 10C-1 to 10C-N of the stripe and generate a code matrix of a multi-dimensional code, as shown in FIG. 2. For example, horizontal codewords HCW1 to HCWN of a code matrix of a multi-dimensional code may be generated by using the codewords HCW1 to HCWN read from the memory blocks 10C-1 to 10C-N.

Figure 3D:
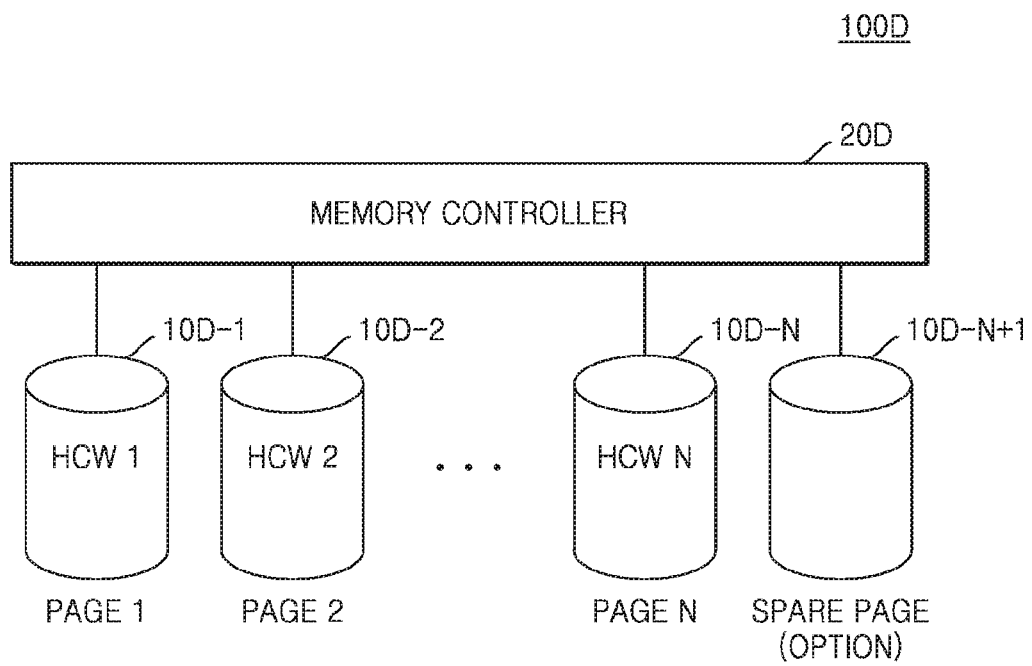
FIG. 3D is a diagram showing another example in which a stripe is configured in the memory system of FIG. 1.

FIG. 3D is a diagram showing an example in which a stripe is configured with pages included in the memory device 10. The memory device 10 may include a plurality of pages 10D-1 to 10D-N+1. For example, a stripe may include N pages 10D-1 to 10D-N (where N is an integer that is equal to or greater than 2), and at least one page 10D-N+1 may be assigned as a spare page. For example, the spare page 10D-N+1 may be used to store data recovered after an ECC decoding process in the pages 10D-1 to 10D-N of the stripe fails. As another example, data recovered after an ECC decoding process in the pages 10D-1 to 10D-N of the stripe fails may be stored in a physical address of the memory device 10 instead of using the spare page 10D-N+1.

A memory controller 20D (corresponding to the memory controller 20) of a memory system 100D (corresponding to the memory system 100) may read codewords HCW1 to HCWN dividedly stored in the pages 10D-1 to 10D-N of the stripe and generate a code matrix of a multi-dimensional code, as shown in FIG. 2. For example, horizontal codewords HCW1 to HCWN of a code matrix of a multi-dimensional code may be generated by using the codewords HCW1 to HCWN read from the pages 10D-1 to 10D-N.

Figure 3E:
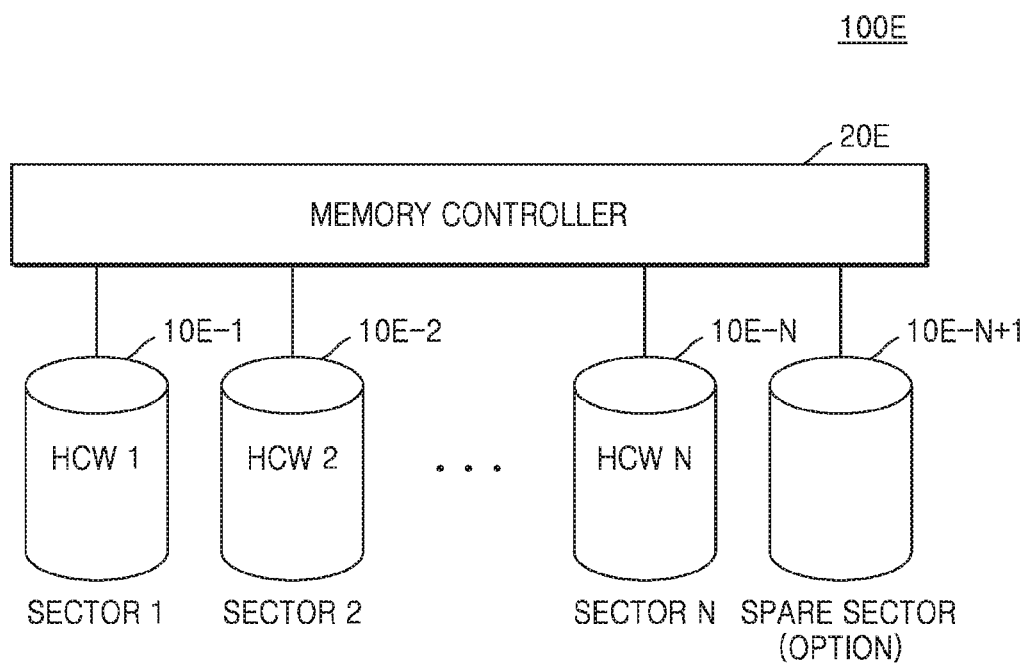
FIG. 3E is a diagram showing another example in which a stripe is configured in the memory system of FIG. 1.

FIG. 3E is a diagram showing an example in which a stripe is configured with sectors included in the memory device 10. The memory device 10 may include a plurality of sectors 10E-1 to 10E-N+1. For example, a stripe may include N sectors 10E-1 to 10E-N (where N is an integer that is equal to or greater than 2), and at least one sector 10E-N+1 may be assigned as a spare sector. For example, the spare sector 10E-N+1 may be used to store data recovered after an ECC decoding process in the sectors 10E-1 to 10E-N of the stripe fails. As another example, data recovered after an ECC decoding process in the sectors 10E-1 to 10E-N of the stripe fails may be stored in a physical address of the memory device 10 instead of using the spare sector 10E-N+1.

A memory controller 20E (corresponding to the memory controller 20) of a memory system 100E (corresponding to the memory system 100) may read codewords HCW1 to HCWN dividedly stored in the sectors 10E-1 to 10E-N of the stripe and generate a code matrix of a multi-dimensional code, as shown in FIG. 2. For example, horizontal codewords HCW1 to HCWN of a code matrix of a multi-dimensional code may be generated by using the codewords HCW1 to HCWN read from the sectors 10E-1 to 10E-N.

Figure 3F:
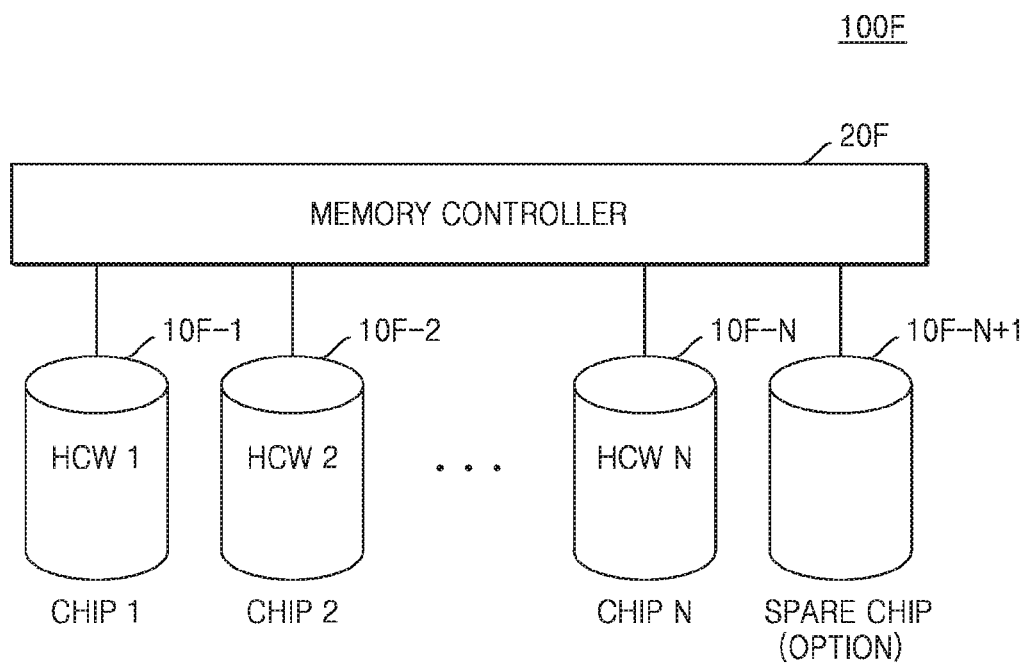
FIG. 3F is a diagram showing another example in which a stripe is configured in the memory system of FIG. 1.

FIG. 3F is a diagram showing an example in which a stripe is configured with memory chips included in the memory device 10. The memory device 10 may include a plurality of memory chips 10E-1 to 10F-N+1. For example, a stripe may include N memory chips 10E-1 to 10F-N (where N is an integer that is equal to or greater than 2), and one memory chip 10F-N+1 may be assigned as a spare memory chip. For example, the spare memory chip 10F-N+1 may be used to store data recovered after an ECC decoding process in the memory chips 10E-1 to 10F-N of the stripe fails. As another example, data recovered after an ECC decoding process in the memory chips 10E-1 to 10F-N of the stripe fails may be stored in a physical address of any one of the memory chips 10E-1 to 10F-N instead of using the spare memory chip 10F-N+1.

A memory controller 20F (corresponding to the memory controller 20) of a memory system 100F (corresponding to the memory system 100) may read codewords HCW1 to HCWN dividedly stored in the memory chips 10E-1 to 10F-N of the stripe and generate a code matrix of a multi-dimensional code, as shown in FIG. 2. For example, horizontal codewords HCW1 to HCWN of a code matrix of a multi-dimensional code may be generated by using the codewords HCW1 to HCWN read from the memory chips 10E-1 to 10F-N.

Figure 4:
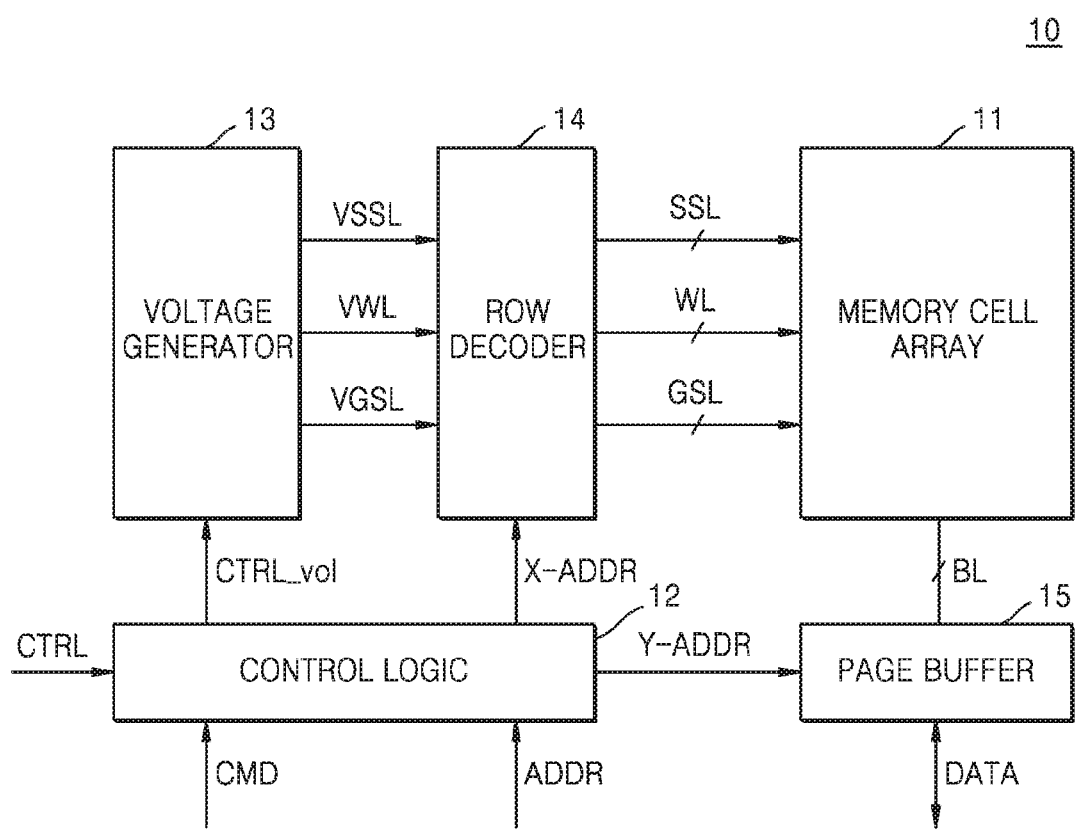
FIG. 4 is a block diagram of a memory device illustrated in FIG. 1.

FIG. 4 is a block diagram of the memory device 10 illustrated in FIG. 1. For example, a memory block may be configured in a plane included in the memory device 10 of FIG. 1.

Referring to FIG. 4, the memory device 10 may include a memory cell array 11, a control logic 12, a voltage generator 13, a row decoder 14, and a page buffer 15.

The memory cell array 11 may include a plurality of memory cells respectively arranged in a plurality of areas where a plurality of word lines intersect a plurality of bit lines. In an embodiment, the plurality of memory cells may be flash memory cells. For example, the memory cell array 11 may be a NAND flash memory cell array or a NOR flash memory cell array. Hereinafter, a case where the plurality of memory cells are NAND flash memory cells will be described in embodiments.

The memory cell array 11 may have a string structure in which memory cells are serially connected to each other. For example, in each of the plurality of cell strings, a ground selection transistor, one or more dummy memory cells, a plurality of main memory cells, and a string selection transistor may be serially connected between a common source line CSL and a bit line BL. The one or more dummy memory cells may be arranged between the ground selection transistor and the plurality of main memory cells to decrease a coupling influence of the common source line CSL on the main memory cells. That is, a dummy memory cell may be disposed in an edge of a main memory cell. The main memory cells and the dummy memory cells connected to a plurality of bit lines may be respectively connected to different word lines. For example, a word line, to which the dummy memory cells are connected, may be referred to as a dummy word line.

In addition, in each cell string, a plurality of memory cells may be programmed in an order from a memory cell closest to a ground selection transistor connected to a global source line (GSL), in order to reduce back pattern dependency that is a drawback of the cell string structure. In this regard, the GSL may be referred to as a ground selection line.

For example, the memory cell array 11 may be designed to have a two-dimensional (2D) planar NAND flash memory cell structure. As another example, the memory cell array 11 may be designed to have a three-dimensional (3D) vertical NAND (VNAND) flash memory cell structure.

In the present embodiment, the memory cell array 11 having a 3D structure may be a circuit that includes an active area disposed on a silicon substrate and is associated with an operation of each memory cell, and may be configured in a monolithic form on a physical level of at least one memory cell array each including a circuit which is provided on or in the substrate. The term "monolithic type" may refer to layers of each level constituting the array being stacked just on layers of each lower level of the array.

In an embodiment, the memory cell array 11 having a 3D structure may include vertical NAND strings which are arranged in a vertical direction so that at least one memory cell is disposed on another memory cell. The at least one memory cell may include a charge trap layer.

U.S. Pat. Nos. 7,679,133, 8,553,466, 8,654,587 and 8,559,235 and U.S. Patent Application No. 2011/0233648 disclose appropriate elements of a 3D memory array which includes a plurality of levels and has word lines and/or bit lines shared between the plurality of levels. The reference documents are incorporated in the present specification by reference in their entireties.

When an erase voltage is applied to the memory cell array 11, a plurality of memory cells MC may be in an erase state. When a program voltage is applied to the memory cell array 11, the plurality of memory cells MC may be in a program state. In this case, each of the memory cells MC may have one of the erase state and first to nth program states P1 to Pn, which are classified based on a threshold voltage.

In this regard, n may be a natural number equal to or greater than two. For example, when each of the memory cells MC is a two-bit level cell, n may be three. As another example, when each of the memory cells MC is a three-bit level cell, n may be seven. As another example, when each of the memory cells MC is a four-bit level cell, n may be fifteen. As described above, the plurality of memory cells MC may include multi-level cells. However, the disclosure is not limited thereto. In some embodiments, the plurality of memory cells MC may include single-level cells.

The control logic 12 may output various control signals for writing data to the memory cell array 11, reading the data from the memory cell array 11, or erasing the memory cell array 11, based on a command CMD, an address ADDR, and a control signal CTRL received from the memory controller 20. Thus, the control logic 12 may control all operations of the memory device 10.

The control logic 12 may generate various control signals for performing a hard decision read operation or a soft decision read operation, based on the command CMD, the address ADDR, and the control signal CTRL received from the memory controller 20.

The control signals generated from the control logic 12 may be supplied to the voltage generator 13, the row decoder 14, and the page buffer 15. For example, the control logic 12 may supply a voltage control signal CTRL_vol to the voltage generator 13, supply a row address X_ADDR to the row decoder 14, and supply a column address Y_ADDR to the page buffer 15.

The voltage generator 13 may generate various kinds of voltages for performing a program operation, a read operation, and an erase operation on the memory cell array 11, based on the voltage control signal CTRL_vol. In detail, the voltage generator 13 may generate a first driving voltage VWL for driving the plurality of word lines WL, a second driving voltage VSSL for driving the plurality of string selection lines SSL, and a third driving voltage VGSL for driving the plurality of ground selection lines GSL.

In this case, the first driving voltage VWL may be a program voltage (or a write voltage), a read voltage, an erase voltage, a pass voltage, or a program verification voltage. Also, the second driving voltage VSSL may be a string selection voltage, namely, an on voltage or an off voltage.

Furthermore, the third driving voltage VGSL may be a ground selection voltage, namely, an on voltage or an off voltage.

The row decoder 14 may be connected to the memory cell array 11 via the plurality of word lines WL and may activate some of the plurality of word lines WL in response to the row address X_ADDR received from the control logic 12. In detail, in the read operation, the row decoder 14 may apply the read voltage to a selected word line and may apply the pass voltage to an unselected word line.

In the program operation, the row decoder 14 may apply the program voltage to a selected word line and may apply the pass voltage to an unselected word line.

In addition, in the erase operation, the row decoder 14 may apply the erase voltage (for example, 0 V) to the word lines WL and may float each of the string selection line SSL and the ground selection line GSL.

The page buffer 15 may be connected to the memory cell array 11 via the plurality of bit lines BL. In detail, in the read operation, the page buffer 15 may operate as a sense amplifier to output data DATA stored in the memory cell array 11. In the program operation, the page buffer 15 may operate as a write driver to input data DATA, which is to be stored in the memory cell array 11, to the memory cell array 11.

Figure 5:
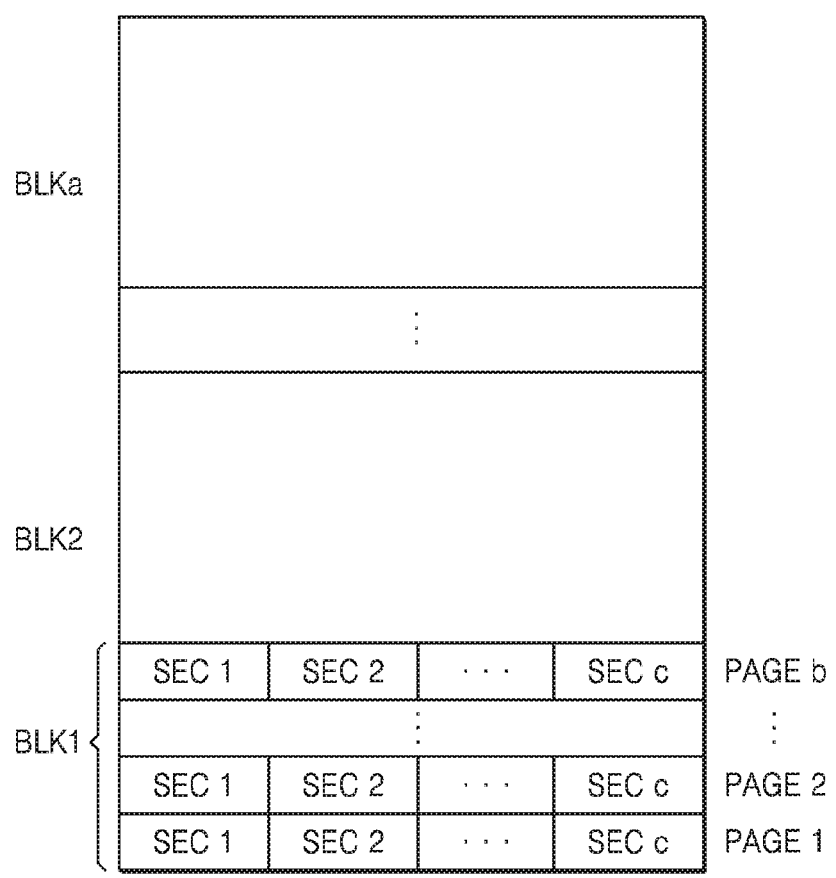
FIG. 5 is a diagram illustrating an example of a memory cell array illustrated in FIG. 4.

FIG. 5 is a diagram illustrating an example of the memory cell array 11 illustrated in FIG. 4.

Referring to FIG. 5, the memory cell array 11 may be a flash memory cell array. In this case, the memory cell array 11 may include a (where a is an integer equal to or greater than two) number of memory blocks BLK1 to BLKa. Each of the memory blocks BLK1 to BLKa may include b (where b is an integer equal to or greater than two) number of pages PAGE1 to PAGEb. Each of the pages PAGE1 to PAGEb may include c (where c is an integer equal to or greater than two) number of sectors SEC1 to SECc. In FIG. 5, for convenience of illustration, only the memory block BLK1 is illustrated as including the pages PAGE1 to PAGEb and the sectors SEC1 to SECc. However, the other memory blocks BLK2 to BLKa may each have the same structure as the memory block BLK1.

Figure 6:
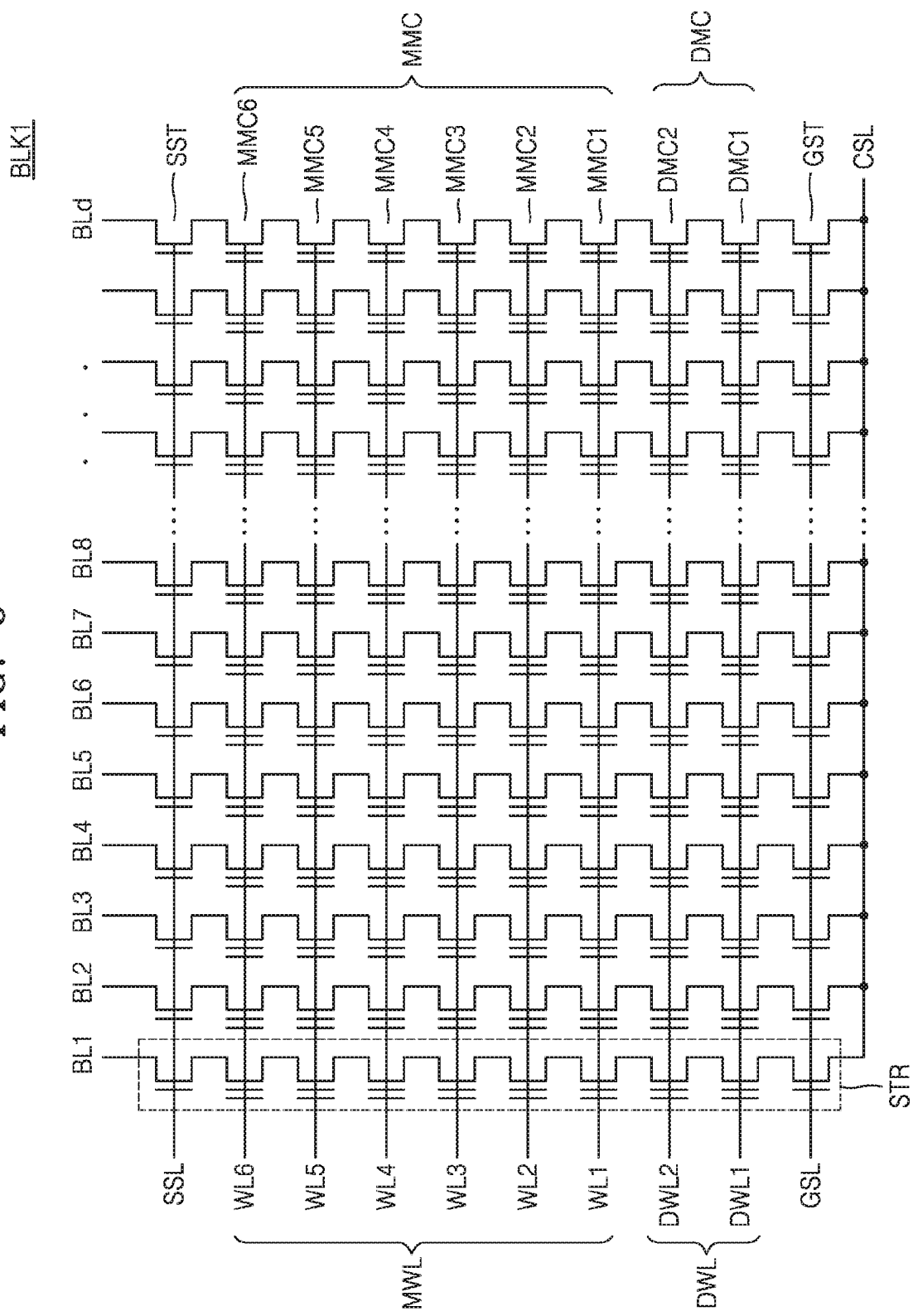
FIG. 6 is a circuit diagram illustrating an example of a memory block included in a memory cell array illustrated in FIG. 5.

FIG. 6 is a circuit diagram illustrating an example of the memory block BLK1 included in the memory cell array 11 illustrated in FIG. 5.

Referring to FIG. 6, a first memory block BLK1 may be a NAND flash memory having a vertical structure, and each of the memory blocks BLK1 to BLKa illustrated in FIG. 5 may be implemented as in FIG. 6. The first memory block BLK1 may include, for example, d (where d is an integer equal to or greater than two) number of cell strings STR BL1 to BLd where eight memory cells are serially connected to each other. Each of the cell strings STR may include a string selection transistor SST and a ground selection transistor GST which are respectively connected to both ends of memory cells serially connected to each other. In this regard, one or more memory cells adjacent to the ground selection transistor GST among eight memory cells included in one cell string may each be set as a dummy memory cell.

In the embodiment of FIG. 6, two memory cells adjacent to the ground selection transistor GST may each be set as a dummy memory cell DMC. Accordingly, six of the eight memory cells included in one cell string may each be set as a main memory cell MMC. As another example, one or more dummy memory cells DMC may be added between the string selection transistor SST and the main memory cell MMC.

In addition, a dummy word line DWL, such as dummy word lines DWL1 and DWL2, may be connected to the dummy memory cells DMC1 and DMC2 respectively, and a main word line MWL, such as main word lines WL1 to WL6, may be connected to the main memory cells MMC1 to MMC6 respectively. As described above, the dummy memory cells DMC1 and DMC2 may be between the ground selection transistor GST and a plurality of main memory cells MMC1 to MMC6 in order to decrease a coupling influence of the common source line CSL on the main memory cells MMC1 to MMC6. That is, one or more dummy memory cells may be arranged at an edge of the main memory cell. A string selection line SSL may be connected to the string selection transistor SST, and a ground selection line GSL may be connected to the ground selection transistor GST.

In this regard, the number of cell strings STR, the number of dummy word lines DWL, the number of main word lines MWL, and the number of bit lines BL may be variously changed according to embodiments.

As another example, the dummy memory cells DMC may not be arranged in each of the memory blocks BLK1 to BLKa, and each of the memory blocks BLK1 to BLKa may include only the main memory cells MMC1 to MMC6.

A NAND flash memory device having a structure illustrated in FIG. 6 may be erased in memory block units and may be programmed in page units corresponding to word lines. For example, when a memory cell is a single level cell, one page may correspond to each word line. As another example, when the memory cell is a multi-level cell or a triple-level cell, a plurality of pages may correspond to each word line.

Figure 7:
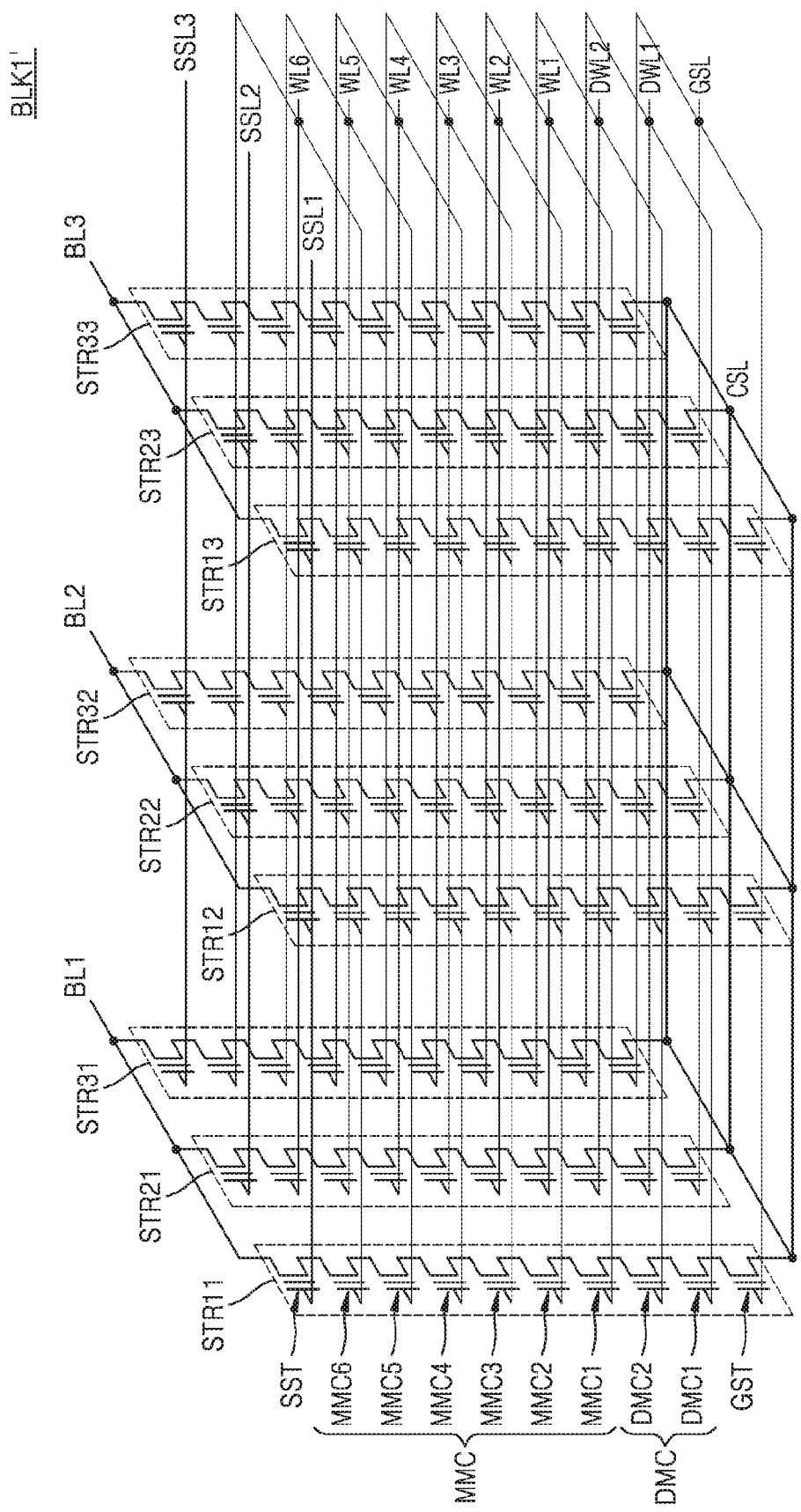
FIG. 7 is a circuit diagram illustrating another example of the memory block included in the memory cell array illustrated in FIG. 5.

FIG. 7 is a circuit diagram illustrating another example of the memory block included in the memory cell array 11 illustrated in FIG. 5.

Referring to FIG. 7, a first memory block BLK1' may be a NAND flash memory having a vertical structure, and each of the memory blocks BLK1 to BLKa illustrated in FIG. 5 may be implemented as in FIG. 7. The first memory block BLK1' may include, for example, a plurality of cell strings STR11 to STR33, a plurality of word lines DWL1, DWL2 and WL1 to WL6, a plurality of bit lines BL1 to BL3, a ground selection line GSL, a plurality of string selection lines SSL1 to SSL3, and a common source line CSL. In this regard, the number of cell strings, the number of word lines, the number of bit lines, the number of ground selection lines, and the number of string selection lines may be variously changed according to embodiments.

The cell strings STR11 to STR33 may be connected between the bit lines BL1 to BL3 and the common source line CSL. Each cell string (for example, STR11) may include a string selection transistor SST, a plurality of memory cells DMC and MMC, and a ground selection transistor GST, which are serially connected to each other.

In the embodiment of FIG. 7, two memory cells DMC1 and DMC2 adjacent to the ground selection transistor GST in each cell string may each be set as a dummy memory cell DMC. Accordingly, six of eight memory cells MMC1 to MMC6 included in one cell string may each be set as a main memory cell MMC. As another example, one or more dummy memory cells DMC may be added between the string selection transistor SST and the main memory cell MMC.

The string selection transistor SST may be connected to the string selection lines SSL1 to SSL3. A plurality of memory cells DMC1, DMC2, and MMC1 to MMC6 may be respectively connected to a plurality of word lines DW1, DW2, and WL1 to WL6 corresponding thereto. The ground selection transistor GST may be connected to the ground selection line GSL. The string selection transistor SST may be connected to a bit line BL corresponding thereto, and the ground selection transistor GST may be connected to the common source line CSL.

Word lines (for example, WL1) of the same height may be connected in common, and the string selection lines SSL1 to SSL3 may be spaced apart from each other. When memory cells, which are connected to the word line WL1 and included in the cell strings STR11 to STR13, are programmed, the word line WL1 and the string selection line SSL1 may be selected.

For example, a stripe may be configured with pages or sectors which include memory cells belonging to different planes in the first memory block BLK1'. As another example, a stripe may be configured with pages or sectors which include memory cells belonging to the same plane in the first memory block BLK1'.

Figure 8:
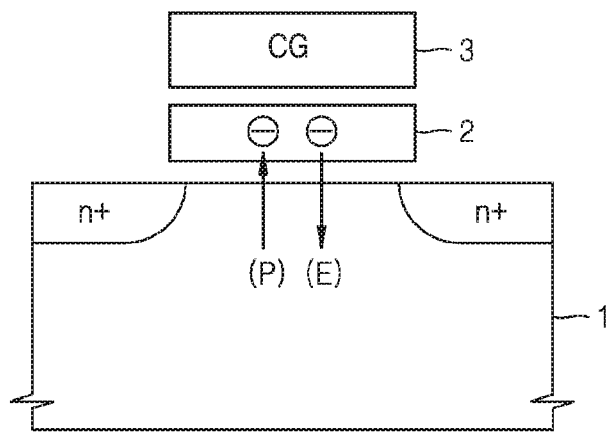
FIG. 8 is a cross-sectional view illustrating an example of a memory cell included in a memory block illustrated in FIG. 6 or FIG. 7.

FIG. 8 is a cross-sectional view illustrating an example of a memory cell included in the memory block illustrated in FIG. 6 or FIG. 7. In this regard, the memory cell may be a dummy memory cell DMC or a main memory cell MMC.

Referring to FIG. 8, the memory cell may include a channel area 1, a charge storage layer 2, and a control gate (CG) 3. For example, the charge storage layer 2 may be implemented with a floating gate which is a conductor, and a memory cell having such a structure may be referred to as a floating gate structure cell. As another example, the charge storage layer 2 may be implemented with a nonconductor, for example, SiN, and a memory cell having such a structure may be referred to as a charge trap flash (CTF) cell.

In order to perform a program operation on a memory cell, a relatively high program voltage may be applied to the control gate CG 3, and a relatively low voltage (for example, 0 V) may be applied to the channel area 1. As, based on such a bias condition, an electric field is generated in a direction from the control gate CG 3 to the channel area 1, electric charges, for example, electrons, may move in an arrow P direction (a direction from the channel area 1 to the charge storage layer 2, and accordingly, the memory cell may be programmed.

In addition, in order to perform an erase operation on the memory cell, a relatively low erase voltage (for example, 0 V) may be applied to the control gate CG 3, and a relatively high voltage may be applied to the channel area 1. As, based on such a bias condition, an electric field is generated in a direction from the channel area 1 to the control gate CG 3, electric charges, for example, electrons, may move in an arrow E direction (a direction from the charge storage layer 2 to the channel area 1), and accordingly, the memory cell may be erased.

Figure 9:
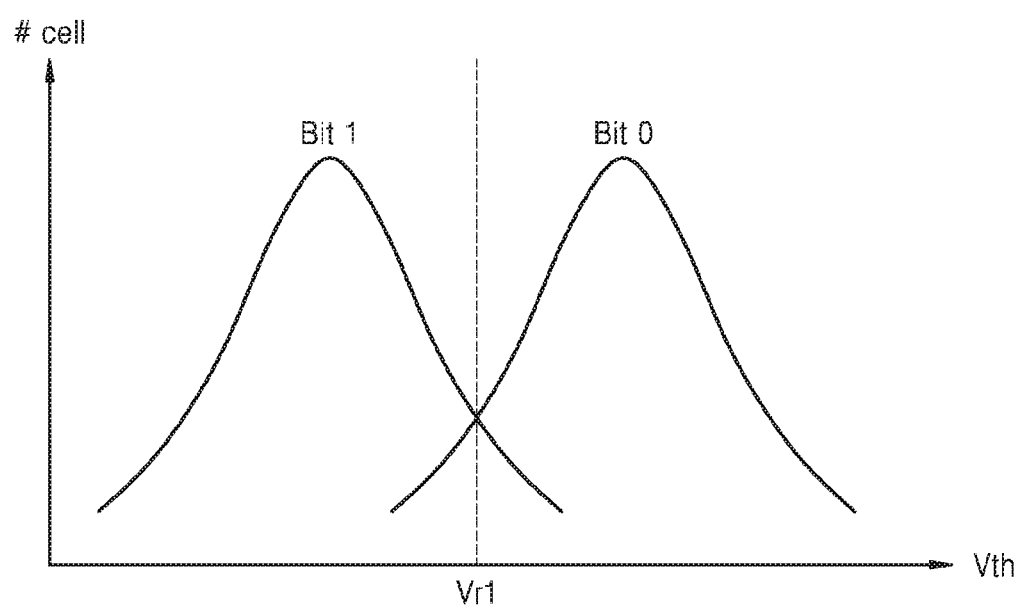
FIG. 9 is a diagram showing an example of a method of generating hard data according to a hard decision read operation in the memory system of FIG. 1.

FIG. 9 is a diagram showing an example of a method of generating hard data according to a hard decision read operation in the memory system 100 of FIG. 1.

The horizontal axis of FIG. 9 indicates a threshold voltage Vth, and the vertical axis of FIG. 9 indicates the number # Cell of memory cells.

In the distribution of threshold voltages Vth of memory cells, shown in FIG. 9, a program state of bit 1 and a program state of bit 0 are determined by a hard decision read operation according to a read voltage Vr1. For example, memory cells having a threshold voltage less than the read voltage Vr1 may be determined to be in a program state of bit 1, and memory cells having a threshold voltage equal to or greater than the read voltage Vr1 may be determined to be in a program state of bit 0.

Bit 1 or bit 0 determined in one memory cell according to a hard decision read operation may be output to the memory controller 20 as a sign bit.

Figure 10:
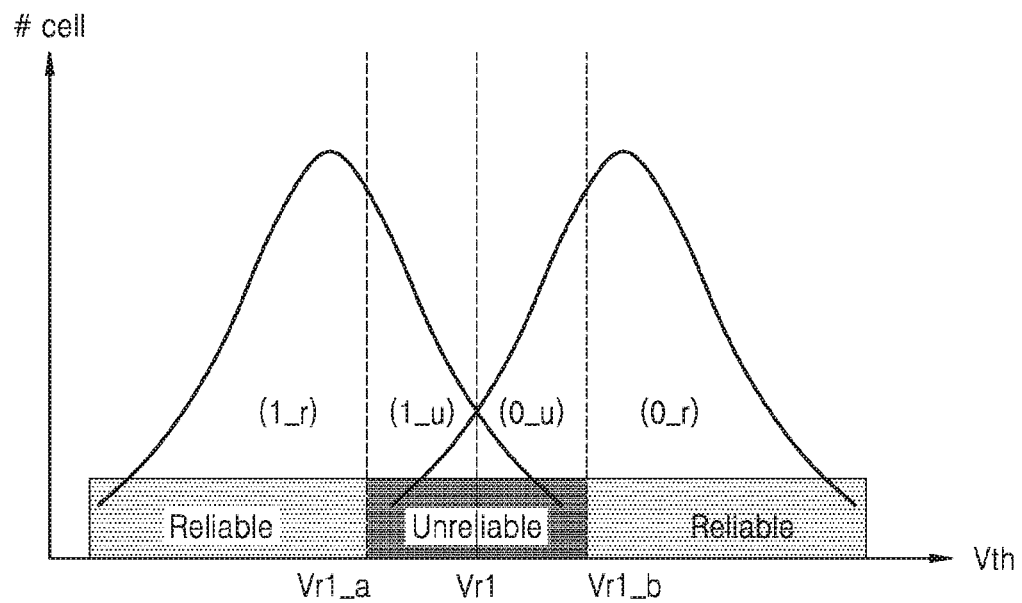
FIG. 10 is a diagram showing an example of a method of generating soft data according to a soft decision read operation in the memory system of FIG. 1.

FIG. 10 is a diagram showing an example of a method of generating soft data according to a soft decision read operation in the memory system 100 of FIG. 1.

In the distribution of threshold voltages Vth of memory cells, shown in FIG. 10, sign bit information for determining a program state of bit 1 and a program state of bit 0 is acquired by a hard decision read operation according to a read voltage Vr1. Then, reliability bit information is acquired by a soft decision read operation according to a read voltage Vr1_a and a read voltage Vr1_b.

One read voltage Vr1_a that is used in the soft decision read operation is determined to be lower than the read voltage Vr1, which is used in the hard decision read operation, by a first voltage, and the other read voltage Vr1_b that is used in the soft decision read operation is determined to be higher than the read voltage Vr1, which is used in the hard decision read operation, by a second voltage. For example, the first voltage and the second voltage may be set to be the same.

Accordingly, with respect to one memory cell, two bits including a sign bit and a reliability bit are output to the memory controller 20 by the soft decision read operation.

For example, in FIG. 10, read data for memory cells having a threshold voltage less than the read voltage Vr1_a is represented as (1_r), read data for memory cells having a threshold voltage between the read voltage Vr1_a and the read voltage Vr1 is represented as (1_u), read data for memory cells having a threshold voltage between the read voltage Vr1 and the read voltage Vr1_b is represented as (0_u), and read data for memory cells having a threshold voltage equal to or greater than the read voltage Vr1_b is represented as (0_r). In this regard, 'u' denotes low reliability and 'r' denotes high reliability. For example, (1_r) denotes bit 1 having high reliability in which a sign bit is '1' and a reliability bit is 'r'.

Figure 11:
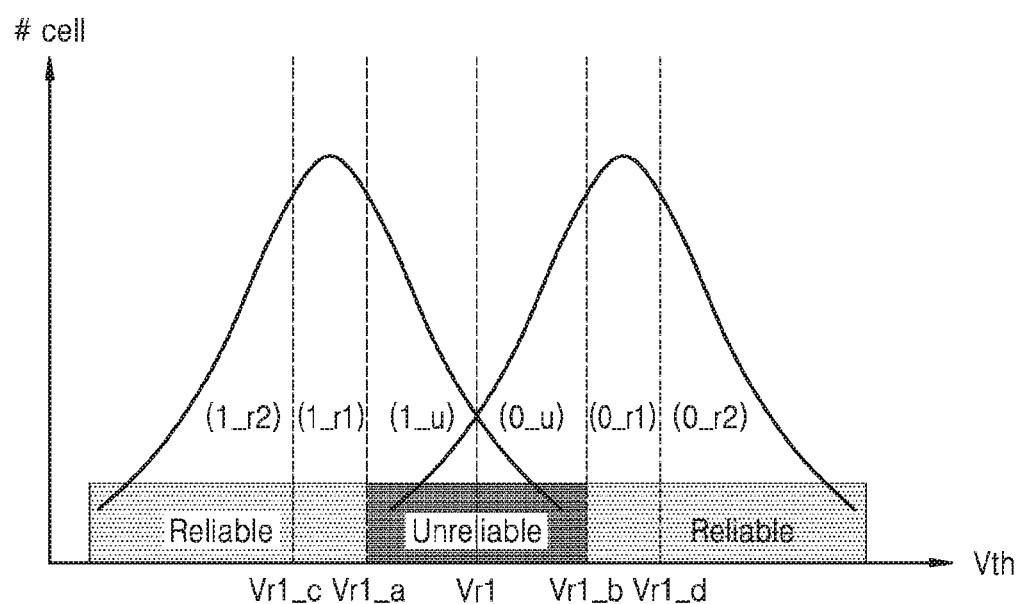
FIG. 11 is a diagram showing an example of a method of generating soft data according to an additional soft decision read operation in the memory system of FIG. 1.

FIG. 11 is a diagram showing an example of a method of generating soft data according to an additional soft decision read operation in the memory system 100 of FIG. 1.

In the distribution of threshold voltages Vth of memory cells, shown in FIG. 11, sign bit information for determining a program state of bit 1 and a program state of bit 0 is acquired by a hard decision read operation according to a read voltage Vr1. In addition, an additional soft decision read operation according to a read voltage Vr1_c and a read voltage Vr1_d is performed after a soft decision read operation according to a read voltage Vr1_a and a read voltage Vr1_b is performed.

One read voltage Vr1_c that is used in the additional soft decision read operation is determined to be lower than the read voltage Vr1_a, which is used in the soft decision read operation, by a third voltage, and the other read voltage Vr1_d that is used in the additional soft decision read operation is determined to be higher than the read voltage Vr1_b, which is used in the soft decision read operation, by a fourth voltage. For example, the third voltage and the fourth voltage may be set to be the same.

Accordingly, with respect to one memory cell, three bits including a sign bit and two reliability bits are output to the memory controller 20 by the additional soft decision read operation.

For example, in FIG. 11, read data for memory cells having a threshold voltage less than the read voltage Vr1_c is represented as (1_$r_2$), read data for memory cells having a threshold voltage between the read voltage Vr1_c and the read voltage Vr1_a is represented as (1_$r_1$), read data for memory cells having a threshold voltage between the read voltage Vr1_a and the read voltage Vr1 is represented as (1_u), read data for memory cells having a threshold voltage between the read voltage Vr1 and the read voltage Vr1_b is represented as (0_u), read data for memory cells having a threshold voltage between the read voltage Vr1_b and the read voltage Vr1_d is represented as (0_$r_1$), and read data for memory cells having a threshold voltage equal to or greater than the read voltage Vr1_d is represented as (0_$r_2$). In this regard, 'u' denotes low reliability, '$r_1$' denotes reliability that is higher than 'u' and is lower than '$r_2$', and '$r_2$' denotes reliability that is higher than '$r_1$'. For example, (1_$r_1$) denotes that a sign bit is '1' and a reliability bit is '$r_1$'.

Figure 12:
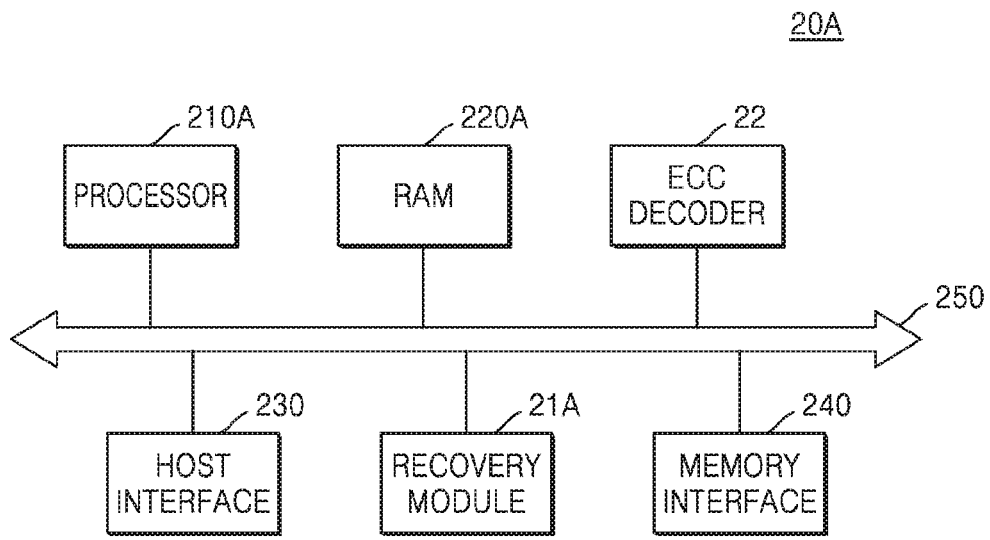
FIG. 12 is a block diagram of a memory controller that is an example of a memory controller illustrated in FIG. 1.

FIG. 12 is a block diagram of a memory controller 20A that is an example of the memory controller 20 included in the memory system 100 of FIG. 1.

As illustrated in FIG. 12, the memory controller 20A may include a processor 210A, a recovery module 21A, an ECC decoder 22, random access memory (RAM) 220A, a host interface 230, a memory interface 240, and a bus 250.

The elements of the memory controller 20A may be electrically connected to each other through the bus 250.

The processor 210A may control all operations of the memory system 100 by using a program code and data stored in the RAM 220A. For example, the processor 210A may be implemented with a microprocessor or a central processing unit (CPU). When the memory system 100 is initialized, the processor 210A may read, from the memory device 10, a program code and data necessary for controlling operations which are performed by the memory system 100, and may load the program code and the data into the RAM 220A. Stripe mapping information may be stored in the RAM 220A. The processor 210A may read data from the memory device 10 based on the stripe mapping information and may generate a code matrix of a multi-dimensional code, as shown in FIG. 2.

The processor 210A may provide a read command and an address to the memory device 10A in a read operation, provide a program command, an address, and data to the memory device 10A in a program operation, and provide an erase command and an address to the memory device 10A in an erase operation. Also, the processor 210A may perform operations necessary for data recovery according to flowcharts illustrated in FIGS. 25 to 32 by using system data stored in the RAM 220A.

The host interface 230 may include a protocol for exchanging data with a host (not shown) connected to the memory system 100 and may connect the memory system 100A and the host to each other. The host interface 230 may be implemented with an advanced technology attachment (ATA) interface, a serial-ATA (SATA) interface, a parallel-ATA (PATA) interface, a universal serial bus (USB), a serial attached small computer system (SAS) interface, a small computer system interface (SCSI), an embedded multimedia card (eMMC) interface, or a universal flash storage (UFS) interface. However, this is merely an example, and the present embodiment is not limited thereto. The host interface 230 may receive a command, an address, and data from the host or may transmit data to the host according to control by the processor 210A.

The memory interface 240 may be electrically connected to the memory device 10. The memory interface 240 may transmit a command, an address, and data to the memory device 10 or may receive data from the memory device 10 according to the control by the processor 210A. The memory interface 240 may be configured to support a NAND flash memory or a NOR flash memory. The memory interface 240 may be configured to perform software or hardware interleaving operations through a plurality of channels.

The ECC decoder 22 performs an error detection and correction process on data read from the memory device 10. For example, an error correction process may be performed by using an LDPC code, a BCH code, a turbo code, and a convolution code.

The processor 210A reads a target codeword requested from the host (not shown) from the memory device 10 according to a soft decision read operation. For example, the size of the target codeword may be determined in ECC decoding process units. For example, a soft input of the target codeword read from the memory device 10 according to a soft decision read operation is represented with two bits including a sign bit and a reliability bit, as described with reference to FIG. 10. The soft input of the target codeword read by the processor 210A is provided to the ECC decoder 22.

When an ECC decoding process for a soft input of a target codeword, performed in the ECC decoder 22, fails, the soft input of the target codeword that has failed in the ECC decoding process is stored in the RAM 220A.

Thereafter, the processor 210A reads reference codewords, which have code correlation with the target codeword, from the memory device 10. The reference codewords may include codewords read from a storage region of the memory device 10, which forms the same stripe as the target codeword. For example, a code matrix, as shown in FIG. 2, may be configured with the target code word and the reference codewords. For example, the target code word and the reference codewords may be horizontal codewords HCW1 to HCWN of a code matrix, as shown in FIG. 2.

For example, the processor 210A reads hard inputs of reference codewords from the memory device 10 by performing a hard decision read operation and provides the read hard inputs of the reference codewords to the ECC decoder 22. The ECC decoder 22 performs an error detection and correction process on the hard inputs of the reference codewords received from the processor 210A. The processor 210A stores a decoding result of a hard input of a reference codeword, which has succeeded in an ECC decoding process, in the RAM 220A. Then, the processor 210A performs a soft decision read operation for acquiring a soft input of a reference codeword that has failed in an ECC decoding process. An error detection and correction process is performed on soft inputs of reference codewords acquired according to a soft decision read operation. The processor 210A stores a decoding result of a soft input of a reference codeword, which has succeeded in an ECC decoding process, and a soft input of a reference codeword, which has failed in an ECC decoding process, in the RAM 220A.

When an ECC decoding process for a target codeword, performed in the ECC decoder 22, fails, the recovery module 21A performs an operation process of generating a corrected target codeword to recover data that has failed in the ECC decoding process. For example, the recovery module 21A may be implemented with a hardware logic circuit.

The recovery module 21A generates a corrected target codeword, based on an operation process according to code correlation, by using a soft input of a target codeword that has failed in an ECC decoding process, a decoding result of a reference codeword that has succeeded in an ECC decoding process, and a soft input of a reference codeword that has failed in an ECC decoding process. The soft input of the target codeword, the decoding result of the reference codeword, and the soft input of the reference codeword, used to generate the corrected target codeword, are read from the RAM 220A.

The recovery module 21A detects a candidate codeword, which does not satisfy a code constraint condition, from a code matrix including a soft input of a target codeword that has failed in an ECC decoding process, a decoding result of a reference codeword that has succeeded in an ECC decoding process, and a soft input of a reference codeword that has failed in an ECC decoding process, and performs an operation process of correcting the target codeword, based on reliability of code bits included in the detected candidate codeword.

For example, the recovery module 21A may arrange a soft input of a target codeword that has failed in an ECC decoding process, a decoding result of a reference codeword that has succeeded in an ECC decoding process, and a soft input of a reference codeword that has failed in an ECC decoding process, as codewords in a first direction of a code matrix, as shown in FIG. 2, and may determine, as a candidate codeword, a codeword in a second direction of the code matrix, in which an error due to a parity check for the second direction of the code matrix occurs. For example, the first direction of the code matrix may be a horizontal direction in which horizontal codewords are arranged, and the second direction of the code matrix is a vertical direction in which vertical codewords are arranged.

For example, the recovery module 21A detects an error candidate code bit having lowest reliability in candidate codeword units by comparing items of reliability of code bits in candidate codeword units, and performs an operation process of correcting an error candidate code bit included in a target codeword. For example, a target codeword may be corrected by a way of inverting a sign bit of an error candidate code bit included in the target codeword.

For example, the recovery module 21A may generate a soft input of a corrected reference codeword for reference codewords, which has failed in an ECC decoding process, by using the same way as an operation process of generating a soft input of a corrected target codeword for a target codeword that has failed in an ECC decoding process.

The soft input of the corrected target codeword generated by the recovery module 21A is provided to the ECC decoder 22. Accordingly, the ECC decoder 22 performs an ECC decoding process again on the soft input of the corrected target codeword. In the same manner, a soft input of a corrected reference codeword generated by the recovery module 21A may be provided to the ECC decoder 22. Accordingly, the ECC decoder 22 may perform an ECC decoding process again on the soft input of the corrected reference codeword and may recover a reference codeword that has failed in an ECC decoding process.

When an ECC decoding process for the soft input of the corrected target codeword, performed again in the ECC decoder 22, fails, an ECC decoding process and a data recovery process may be performed through a process as described above, based on a soft input acquired after an additional soft decision read operation as described above with reference to FIG. 11 is performed.

When an ECC decoding process for the soft input of the corrected target codeword succeeds, the processor 210A may write an ECC decoding result for an input of the corrected target codeword into a new physical address of the memory device 10 and may update stripe mapping information based on the new physical address into which the ECC decoding result has been written.

When an ECC decoding process for a soft input of a corrected reference codeword is performed again and succeeds, the processor 210A may write an ECC decoding result for an input of the corrected reference codeword into a new physical address of the memory device 10 and may update stripe mapping information based on the new physical address into which the ECC decoding result has been written.

Figure 13:
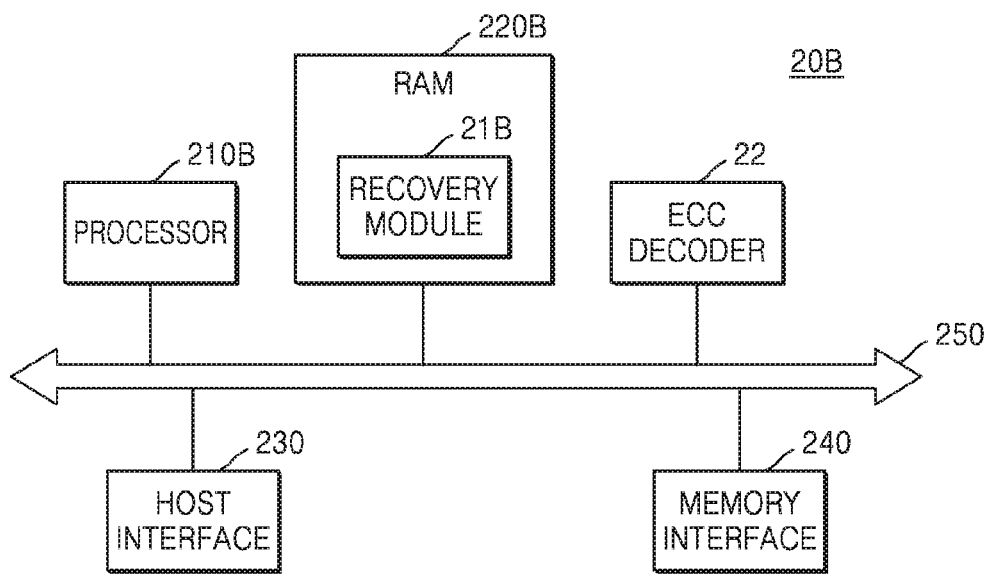
FIG. 13 is a block diagram of a memory controller that is another example of the memory controller illustrated in FIG. 1.

FIG. 13 is a block diagram of a memory controller 20B that is another example of the memory controller 20 included in the memory system 100 of FIG. 1.

As illustrated in FIG. 13, the memory controller 20B may include a processor 210B, an ECC decoder 22, RAM 220B, a host interface 230, a memory interface 240, and a bus 250.

A program code and data necessary for controlling operations which are performed by the memory system 100 may be stored in the RAM 220B. For example, when the memory system 100 is initialized, the processor 210B may read, from the memory device 10, the program code and the data necessary for controlling the operations which are performed by the memory system 100, and may load the program code and the data into the RAM 220B. In addition, the RAM 220B may store a program code of a recovery module 21B which is implemented with software.

The processor 210B may control all operations of the memory system 100 by using the program code and the data stored in the RAM 220B. For example, the processor 210B may perform a data recovery process as described above with reference to FIG. 12 by using the program code of the recovery module 21B stored in the RAM 220B.

The ECC decoder 22, the host interface 230, the memory interface 240, and the bus 250 have been described above with reference to FIG. 12, and thus, their repeated descriptions are not provided.

Figure 14:
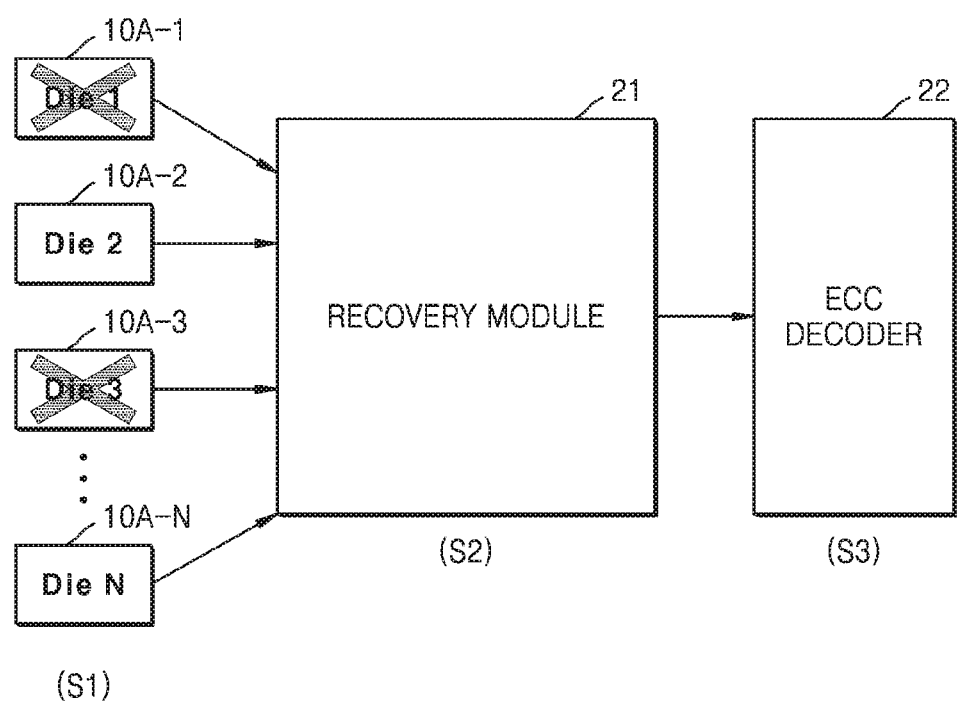
FIG. 14 is a diagram showing an operation of performing a data recovery process in the memory system of FIG. 1.

FIG. 14 is a diagram showing an operation of performing a data recovery process in the memory system 100 of FIG. 1.

For example, when an ECC decoding process for a target codeword, performed in the memory system 100, fails, an operation of reading reference codewords, which have code correlation with the target codeword, from a plurality of dies, i.e., first to N-th dies 10A-1 to 10A-N, is performed (Operation S1). FIG. 14 shows an example in which an ECC decoding process for a target codeword read from the first die 10A-1 has failed and an ECC decoding process for a reference codeword read from the third die 10A-3 has failed. For example, a stripe using a RAID may be configured with the plurality of dies 10A-1 to 10A-N.

When an ECC decoding process in two or more dies in the memory system 100 fails, the recovery module 21 performs an operation process of correcting a target codeword based on an operation process according to code correlation which uses the target code word and reference codewords (Operation S2).

The ECC decoder 22 receives a corrected target codeword from the recovery module 21 and recovers a target codeword by performing an ECC decoding process again on the corrected target codeword (Operation S3).

Various examples of performing a data recovery process in the memory system 100 will be described with reference to FIGS. 15 to 22.

In FIGS. 15 to 22, it is assumed that a stripe is configured with first to sixth dies 10A-1 to 10A-6. In addition, it is assumed that the first die 10A-1 stores a target codeword and the second to sixth dies 10A-2 to 10A-6 store a target codeword and reference codewords forming a stripe.

Figure 15:
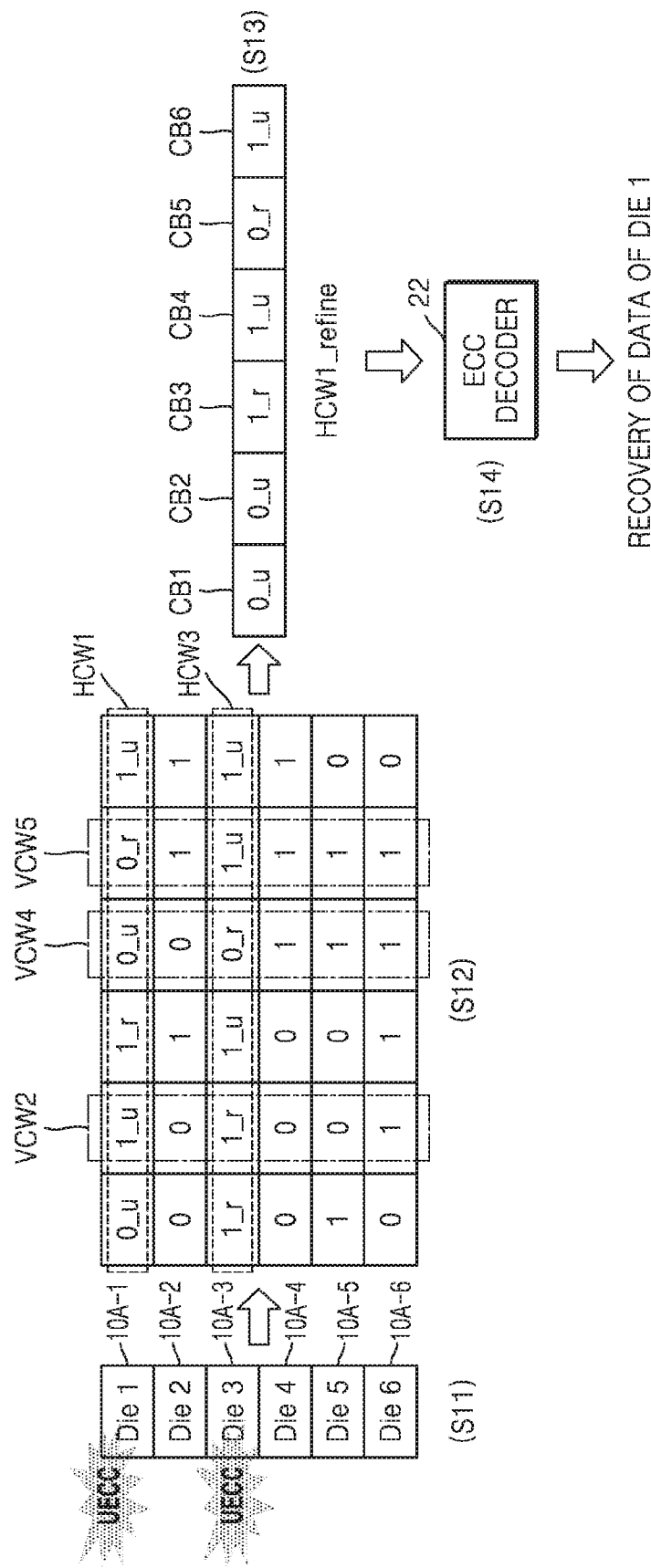
FIG. 15 is a diagram showing an example of performing a data recovery process in the memory system of FIG. 1.

FIG. 15 is a diagram showing an example of performing a data recovery process in the memory system 100 of FIG. 1.

FIG. 15 shows an example in which an ECC decoding process for a target codeword of the first die 10A-1 has failed and an ECC decoding process for a reference codeword of the third die 10A-3 has failed.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S11).

The recovery module 21 performs an operation process of correcting the target codeword by using a soft input HCW1 of a target codeword of the first die 10A-1 that has failed in an ECC decoding process, a soft input HCW3 of a reference codeword of the third die 10A-3 that has failed in an ECC decoding process, and decoding results of reference codewords of the second, fourth, fifth, and sixth dies 10A-2, 10A-4, 10A-5, and 10A-6 that have succeeded in an ECC decoding process (Operation S12).

For example, a first horizontal codeword HCW1 of a code matrix is configured with a soft input of a target codeword of the first die 10A-1 that has failed in an ECC decoding process, and a third horizontal codeword HCW3 of the code matrix is configured with a soft input of a reference codeword of the third die 10A-3 that has failed in an ECC decoding process. In addition, the remaining horizontal codewords of the code matrix are configured with decoding results of reference codewords of the second, fourth, fifth, and sixth dies 10A-2, 10A-4, 10A-5, and 10A-6 that have succeeded in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2, a fourth vertical codeword VCW4, and a fifth vertical codeword VCW5 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include [1_u, 0, 1_r, 0, 0, 1]. Among the code bits of the second vertical codeword VCW2, code bits '0' and '1' corresponding to the decoding results are code bits having highest reliability. Accordingly, an error candidate code bit having lowest reliability may be detected by comparing items of reliability of code bits corresponding to a soft input from among the code bits of the second vertical codeword VCW2. As a result, '1_u', which is a first code bit of the code bits of the second vertical codeword VCW2, is detected as an error candidate code bit having lowest reliability.

In the same manner, '0_u', which is a first code bit of code bits [0_u, 0, 0_r, 1, 1, 1] of the fourth vertical codeword VCW4 in which a code constraint condition is not satisfied, is detected as an error candidate code bit having lowest reliability. In addition, '1_u', which is a third code bit of code bits [0_r, 1, 1_u, 1, 1, 1] of the fifth vertical codeword VCW5 in which a code constraint condition is not satisfied, is detected as an error candidate code bit having lowest reliability.

When a soft input of a target codeword includes an error candidate code bit detected in this manner, the recovery module 21 performs an operation process of inverting a sign bit of the corresponding error candidate code bit. That is, second and fourth code bits CB2 and CB4 of code bits of the first horizontal codeword HCW1 of the code matrix are error candidate code bits. Accordingly, sign bits of the second and fourth code bits CB2 and CB4 of the first horizontal codeword HCW1 are inverted. That is, '1_u' that is the second code bit CB2 is changed to '0_u', and '0_u' that is the fourth code bit CB4 is changed to '1_u'.

Accordingly, the first horizontal codeword HCW1 is changed from [0_u, 1_u, 1_r, 0_u, 0_r, 1_u] to [0_u, 0_u, 1_r, 1_u, 0_r, 1_u]. The recovery module 21 outputs a horizontal codeword HCW1_refine corrected according to the operation process described above for the ECC decoder 22 (Operation S13).

The ECC decoder 22 receives the corrected horizontal codeword HCW1_refine from the recovery module 21 and recovers a target codeword by performing an ECC decoding process again on the corrected horizontal codeword HCW1_refine (Operation S14). In this regard, since the corrected horizontal codeword HCW1_refine corresponds to a soft input of a corrected target codeword, the target codeword may be recovered by performing an ECC decoding process again on a soft input of a corrected target codeword of the first die 10A-1.

Figure 16:
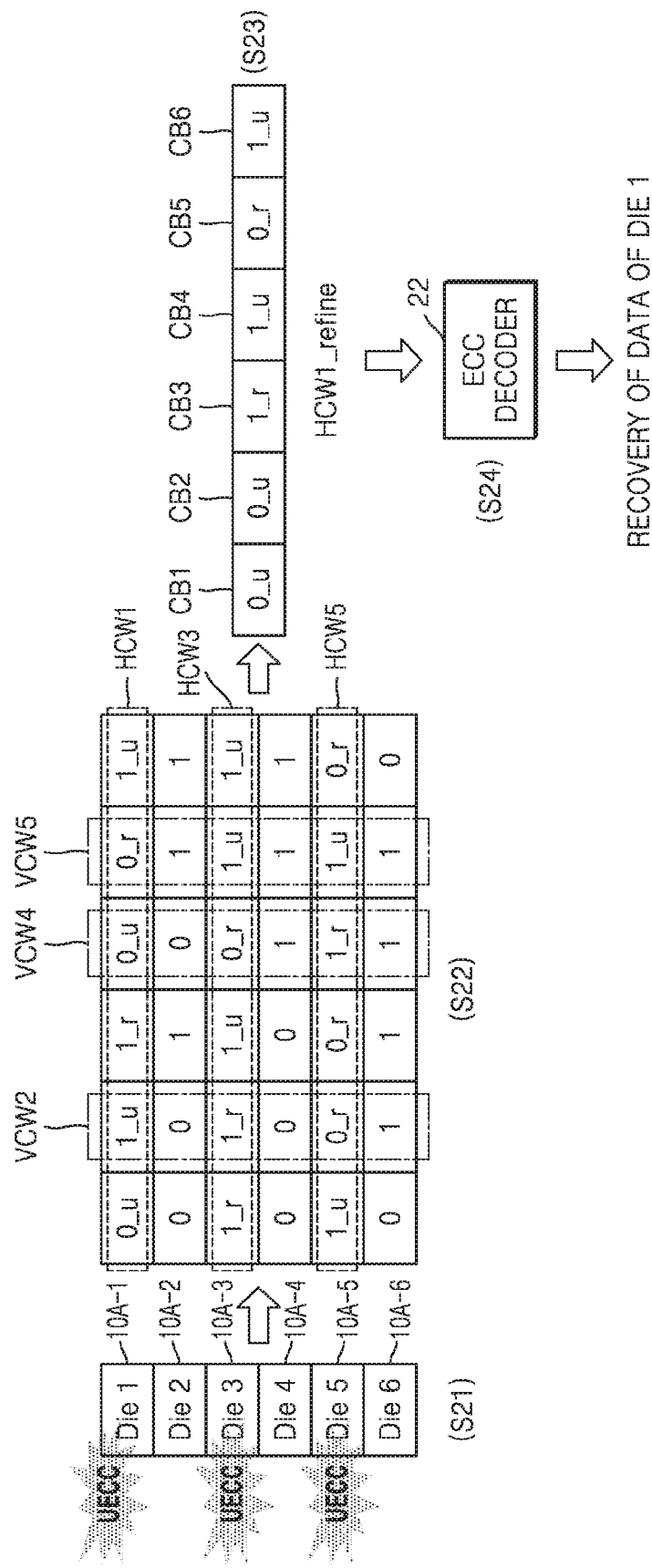
FIG. 16 is a diagram showing another example of performing a data recovery process in the memory system of FIG. 1.

FIG. 16 is a diagram showing another example of performing a data recovery process in the memory system 100 of FIG. 1.

FIG. 16 shows an example in which an ECC decoding process for a target codeword of the first die 10A-1 has failed and an ECC decoding process for reference codewords of the third and fifth dies 10A-3 and 10A-5 has failed.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S21).

The recovery module 21 performs an operation process of correcting the target codeword by using a soft input HCW1 of a target codeword of the first die 10A-1 that has failed in an ECC decoding process, soft inputs HCW3 and HCW5 of reference codewords of the third and fifth dies 10A-3 and 10A-5 that have failed in an ECC decoding process, and decoding results of reference codewords of the second, fourth, and sixth dies 10A-2, 10A-4, and 10A-6 that have succeeded in an ECC decoding process (Operation S22).

For example, a first horizontal codeword HCW1 of a code matrix may be configured with a soft input of a target codeword of the first die 10A-1 that has failed in an ECC decoding process, a third horizontal codeword HCW3 of the code matrix may be configured with a soft input of a reference codeword of the third die 10A-3 that has failed in an ECC decoding process, and a fifth horizontal codeword HCW5 of the code matrix may be configured with a soft input of a reference codeword of the fifth die 10A-5 that has failed in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2, a fourth vertical codeword VCW4, and a fifth vertical codeword VCW5 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include [1_u, 0, 1_r, 0, 0_r, 1]. Among the code bits of the second vertical codeword VCW2, code bits '0' and '1' corresponding to the decoding results are code bits having highest reliability. Accordingly, an error candidate code bit having lowest reliability may be detected by comparing items of reliability of code bits corresponding to a soft input from among the code bits of the second vertical codeword VCW2. As a result, '1_u', which is a first code bit of the code bits of the second vertical codeword VCW2, is detected as an error candidate code bit having lowest reliability.

In the same manner, '0_u', which is a first code bit of code bits [0_u, 0, 0_r, 1, 1_r, 1] of the fourth vertical codeword VCW4 in which a code constraint condition is not satisfied, is detected as an error candidate code bit having lowest reliability. In addition, third and fifth code bits of code bits [0_r, 1, 1_u, 1, 1_u, 1] of the fifth vertical codeword VCW5 in which a code constraint condition is not satisfied are error candidate code bits having lowest reliability. In this manner, when a plurality of code bits having lowest reliability are detected in a vertical codeword in which a code constraint condition is not satisfied, it is determined that an error candidate code bit is not detected in the corresponding vertical codeword. Accordingly, it is determined that an error candidate code bit is not detected in the fifth vertical codeword VCW5.

When a soft input of a target codeword includes an error candidate code bit detected in this manner, the recovery module 21 performs an operation process of inverting a sign bit of the corresponding error candidate code bit. That is, second and fourth code bits CB2 and CB4 of code bits of the first horizontal codeword HCW1 of the code matrix are error candidate code bits. Accordingly, sign bits of the second and fourth code bits CB2 and CB4 of the first horizontal codeword HCW1 are inverted. That is, '1_u' that is the second code bit CB2 is changed to '0_u', and '0_u' that is the fourth code bit CB4 is changed to '1_u'.

Accordingly, the first horizontal codeword HCW1 is changed from [0_u, 1_u, 1_r, 0_u, 0_r, 1_u] to [0_u, 0_u, 1_r, 1_u, 0_r, 1_u]. The recovery module 21 outputs a horizontal codeword HCW1_refine corrected according to the operation process described above for the ECC decoder 22 (Operation S23).

The ECC decoder 22 receives the corrected horizontal codeword HCW1_refine from the recovery module 21 and recovers a target codeword by performing an ECC decoding process again on the corrected horizontal codeword HCW1_refine (Operation S24). In this regard, since the corrected horizontal codeword HCW1_refine corresponds to a soft input of a corrected target codeword, the target codeword may be recovered by performing an ECC decoding process again on a soft input of a corrected target codeword of the first die 10A-1.

Figure 17:
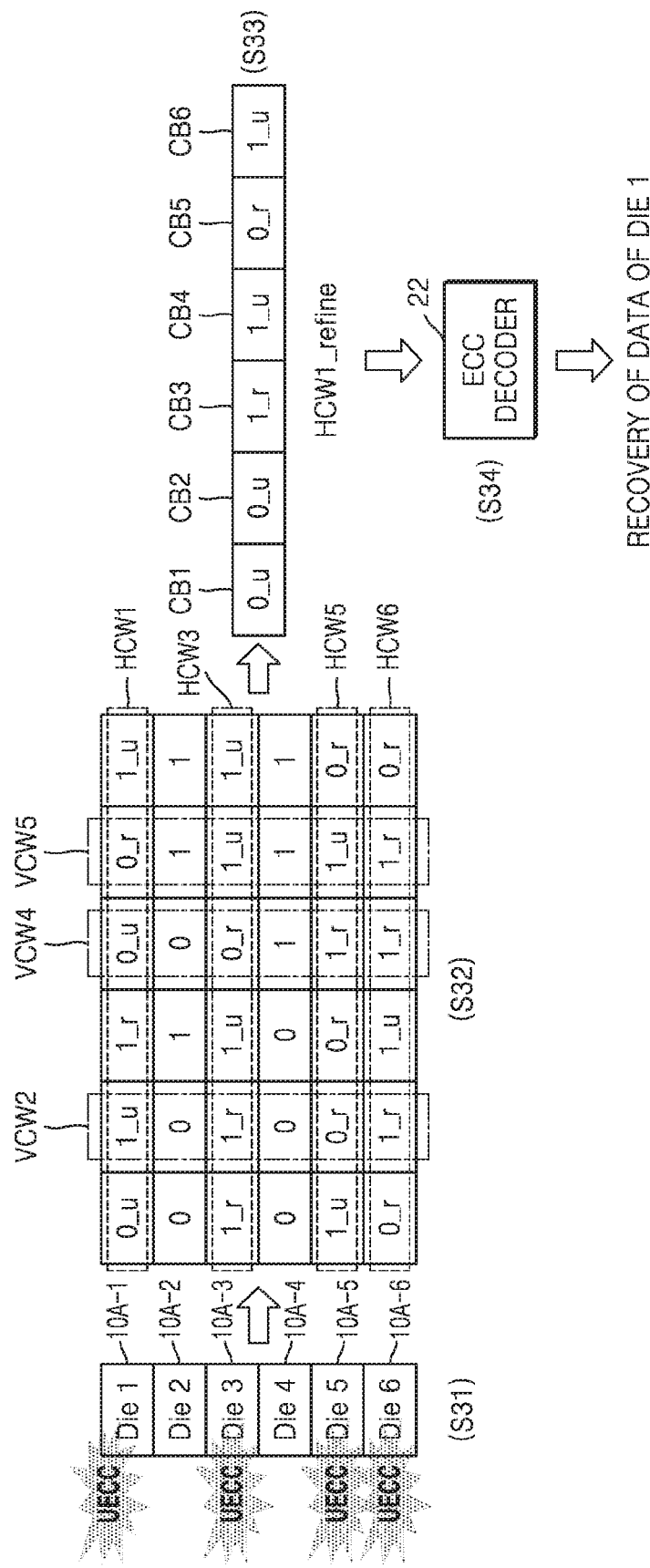
FIG. 17 is a diagram showing another example of performing a data recovery process in the memory system of FIG. 1.

FIG. 17 is a diagram showing another example of performing a data recovery process in the memory system 100 of FIG. 1.

FIG. 17 shows an example in which an ECC decoding process for a target codeword of the first die 10A-1 has failed and an ECC decoding process for reference codewords of the third, fifth, and sixth dies 10A-3, 10A-5, and 10A-6 has failed.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S31).

The recovery module 21 performs an operation process of correcting the target codeword by using a soft input HCW1 of a target codeword of the first die 10A-1 that has failed in an ECC decoding process, soft inputs HCW3, HCW5, and HCW6 of reference codewords of the third, fifth, and sixth dies 10A-3, 10A-5, and 10A-6 that have failed in an ECC decoding process, and decoding results of reference codewords of the second and fourth dies 10A-2 and 10A-4 that have succeeded in an ECC decoding process (Operation S32).

For example, a first horizontal codeword HCW1 of a code matrix may be configured with a soft input of a target codeword of the first die 10A-1 that has failed in an ECC decoding process, a third horizontal codeword HCW3 of the code matrix may be configured with a soft input of a reference codeword of the third die 10A-3 that has failed in an ECC decoding process, a fifth horizontal codeword HCW5 of the code matrix may be configured with a soft input of a reference codeword of the fifth die 10A-5 that has failed in an ECC decoding process, and a sixth horizontal codeword HCW6 of the code matrix may be configured with a soft input of a reference codeword of the sixth die 10A-6 that has failed in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2, a fourth vertical codeword VCW4, and a fifth vertical codeword VCW5 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include [1_u, 0, 1_r, 0, 0_r, 1_r]. Among the code bits of the second vertical codeword VCW2, code bits '0' and '1' corresponding to the decoding results are code bits having highest reliability. Accordingly, an error candidate code bit having lowest reliability may be detected by comparing items of reliability of code bits corresponding to a soft input from among the code bits of the second vertical codeword VCW2. As a result, '1_u', which is a first code bit of the code bits of the second vertical codeword VCW2, is detected as an error candidate code bit having lowest reliability.

In the same manner, '0_u', which is a first code bit of code bits [0_u, 0, 0_r, 1, 1_r, 1_r] of the fourth vertical codeword VCW4 in which a code constraint condition is not satisfied, is detected as an error candidate code bit having lowest reliability. In addition, third and fifth code bits of code bits [0_r, 1, 1_u, 1, 1_u, 1_r] of the fifth vertical codeword VCW5 in which a code constraint condition is not satisfied are error candidate code bits having lowest reliability. In this manner, when a plurality of code bits having lowest reliability are detected in a vertical codeword in which a code constraint condition is not satisfied, it is determined that an error candidate code bit is not detected in the corresponding vertical codeword. Accordingly, it is determined that an error candidate code bit is not detected in the fifth vertical codeword VCW5.

When a soft input of a target codeword includes an error candidate code bit detected in this manner, the recovery module 21 performs an operation process of inverting a sign bit of the corresponding error candidate code bit. That is, second and fourth code bits CB2 and CB4 of code bits of the first horizontal codeword HCW1 of the code matrix are error candidate code bits. Accordingly, sign bits of the second and fourth code bits CB2 and CB4 of the first horizontal codeword HCW1 are inverted. That is, '1_u' that is the second code bit CB2 is changed to '0_u', and '0_u' that is the fourth code bit CB4 is changed to '1_u'.

Accordingly, the first horizontal codeword HCW1 is changed from [0_u, 1_u, 1_r, 0_u, 0_r, 1_u] to [0_u, 0_u, 1_r, 1_u, 0_r, 1_u]. The recovery module 21 outputs a horizontal codeword HCW1_refine corrected according to the operation process described above for the ECC decoder 22 (Operation S33).

The ECC decoder 22 receives the corrected horizontal codeword HCW1_refine from the recovery module 21 and recovers a target codeword by performing an ECC decoding process again on the corrected horizontal codeword HCW1_refine (Operation S34). In this regard, since the corrected horizontal codeword HCW1_refine corresponds to a soft input of a corrected target codeword, the target codeword may be recovered by performing an ECC decoding process again on a soft input of a corrected target codeword of the first die 10A-1.

Figure 18:
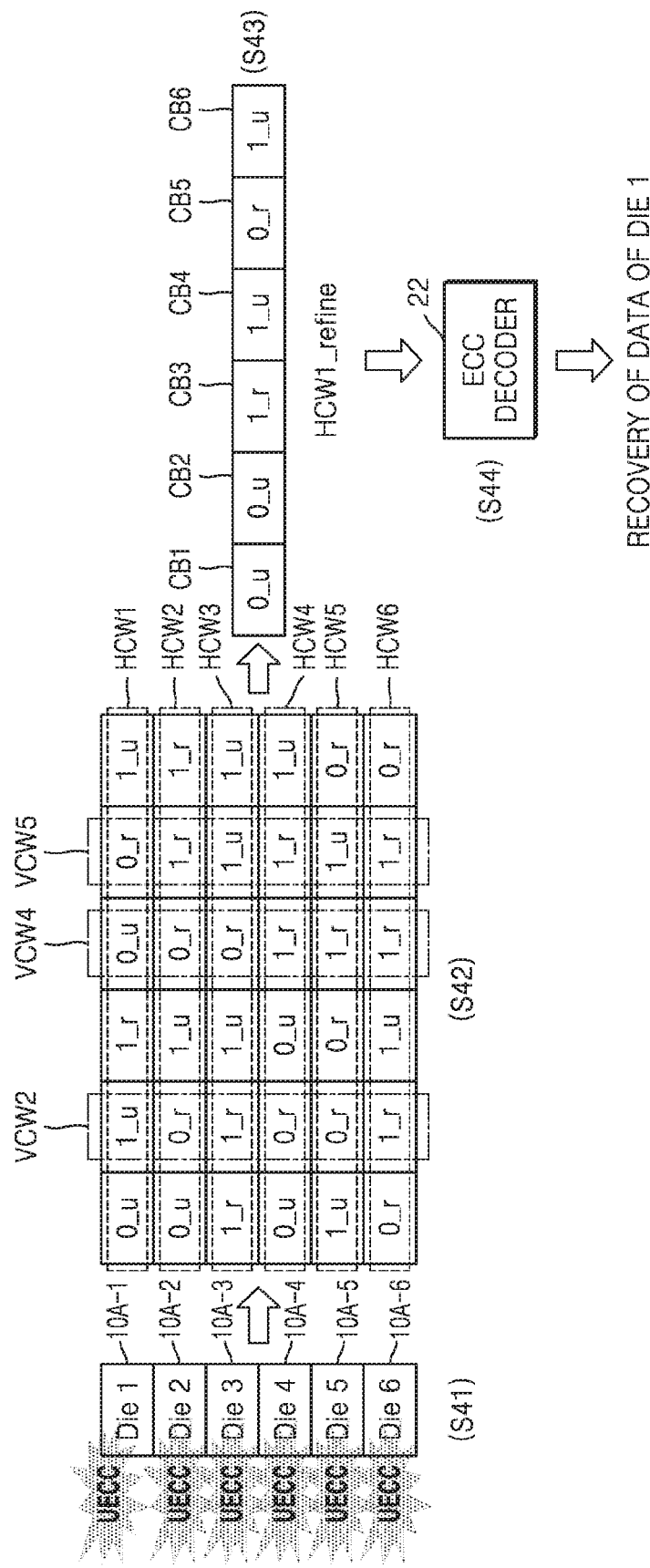
FIG. 18 is a diagram showing another example of performing a data recovery process in the memory system of FIG. 1.

FIG. 18 is a diagram showing another example of performing a data recovery process in the memory system 100 of FIG. 1.

FIG. 18 shows an example in which an ECC decoding process for a target codeword of the first die 10A-1 has failed and an ECC decoding process for reference codewords of the second, third, fourth, fifth, and sixth dies 10A-2, 10A-3, 10A-4, 10A-5, and 10A-6 has failed. That is, FIG. 18 shows an example in which an ECC decoding process for all dies configuring a stripe has failed.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S41).

The recovery module 21 performs an operation process of correcting the target codeword by using a soft input HCW1 of a target codeword of the first die 10A-1 that has failed in an ECC decoding process, and soft inputs HCW2, HCW3, HCW4, HCW5, and HCW6 of reference codewords of the second, third, fourth, fifth, and sixth dies 10A-2, 10A-3, 10A-4, 10A-5, and 10A-6 that have failed in an ECC decoding process (Operation S42).

For example, a first horizontal codeword HCW1 of a code matrix may be configured with a soft input of a target codeword of the first die 10A-1 that has failed in an ECC decoding process, a second horizontal codeword HCW2 of the code matrix may be configured with a soft input of a reference codeword of the second die 10A-2 that has failed in an ECC decoding process, a third horizontal codeword HCW3 of the code matrix may be configured with a soft input of a reference codeword of the third die 10A-3 that has failed in an ECC decoding process, a fourth horizontal codeword HCW4 of the code matrix may be configured with a soft input of a reference codeword of the fourth die 10A-4 that has failed in an ECC decoding process, a fifth horizontal codeword HCW5 of the code matrix may be configured with a soft input of a reference codeword of the fifth die 10A-5 that has failed in an ECC decoding process, and a sixth horizontal codeword HCW6 of the code matrix may be configured with a soft input of a reference codeword of the sixth die 10A-6 that has failed in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2, a fourth vertical codeword VCW4, and a fifth vertical codeword VCW5 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include [1_u, 0_r, 1_r, 0_r, 0_r, 1_r]. An error candidate code bit having lowest reliability may be detected by comparing items of reliability of code bits for a soft input of the second vertical codeword VCW2. As a result, '1_u', which is a first code bit of the code bits of the second vertical codeword VCW2, is detected as an error candidate code bit having lowest reliability.

In the same manner, '0_u', which is a first code bit of code bits [0_u, 0_r, 0_r, 1_r, 1_r, 1_r] of the fourth vertical codeword VCW4 in which a code constraint condition is not satisfied, is detected as an error candidate code bit having lowest reliability. In addition, third and fifth code bits of code bits [0_r, 1_r, 1_u, 1_r, 1_u, 1_r] of the fifth vertical codeword VCW5 in which a code constraint condition is not satisfied are error candidate code bits having lowest reliability. In this manner, when a plurality of code bits having lowest reliability are detected in a vertical codeword in which a code constraint condition is not satisfied, it is determined that an error candidate code bit is not detected in the corresponding vertical codeword. Accordingly, it is determined that an error candidate code bit is not detected in the fifth vertical codeword VCW5.

When a soft input of a target codeword includes an error candidate code bit detected in this manner, the recovery module 21 performs an operation process of inverting a sign bit of the corresponding error candidate code bit. That is, second and fourth code bits CB2 and CB4 of code bits of the first horizontal codeword HCW1 of the code matrix are error candidate code bits. Accordingly, sign bits of the second and fourth code bits CB2 and CB4 of the first horizontal codeword HCW1 are inverted. That is, '1_u' that is the second code bit CB2 is changed to '0_u', and '0_u' that is the fourth code bit CB4 is changed to '1_u'.

Accordingly, the first horizontal codeword HCW1 is changed from [0_u, 1_u, 1_r, 0_u, 0_r, 1_u] to [0_u, 0_u, 1_r, 1_u, 0_r, 1_u]. The recovery module 21 outputs a horizontal codeword HCW1_refine corrected according to the operation process described above for the ECC decoder 22 (Operation S43).

The ECC decoder 22 receives the corrected horizontal codeword HCW1_refine from the recovery module 21 and recovers a target codeword by performing an ECC decoding process again on the corrected horizontal codeword HCW1_refine (Operation S44). In this regard, since the corrected horizontal codeword HCW1_refine corresponds to a soft input of a corrected target codeword, the target codeword may be recovered by performing an ECC decoding process again on a soft input of a corrected target codeword of the first die 10A-1.

Figure 19:
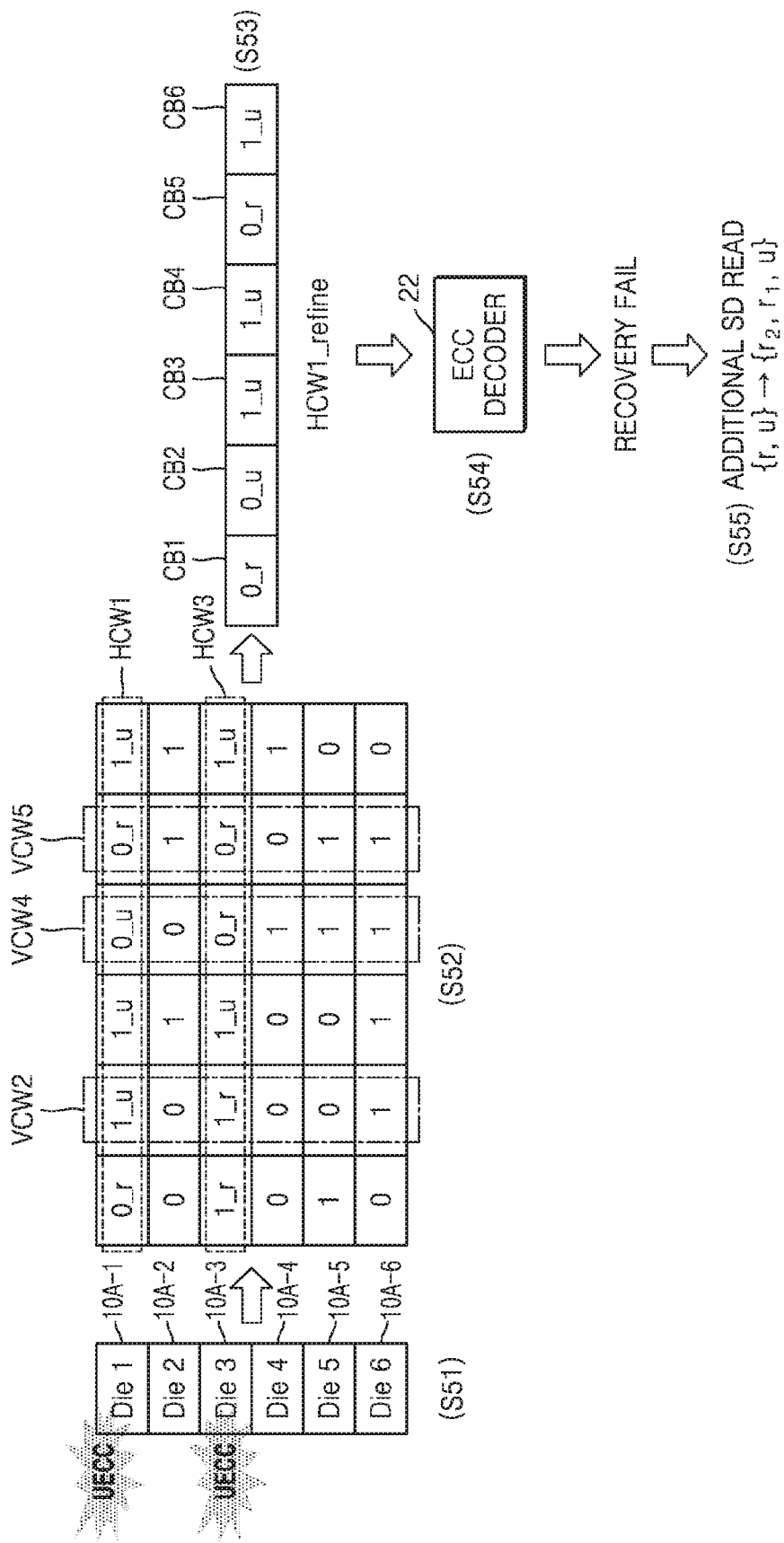
FIG. 19 is a diagram showing another example of performing a data recovery process in the memory system of FIG. 1.

FIG. 19 is a diagram showing an example of performing a data recovery process in the memory system 100 of FIG. 1.

FIG. 19 shows an example in which an ECC decoding process for a target codeword of the first die 10A-1 has failed and an ECC decoding process for a reference codeword of the third die 10A-3 has failed.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S51).

The recovery module 21 performs an operation process of correcting the target codeword by using a soft input HCW1 of a target codeword of the first die 10A-1 that has failed in an ECC decoding process, a soft input HCW3 of a reference codeword of the third die 10A-3 that has failed in an ECC decoding process, and decoding results of reference codewords of the second, fourth, fifth, and sixth dies 10A-2, 10A-4, 10A-5, and 10A-6 that have succeeded in an ECC decoding process (Operation S52).

For example, a first horizontal codeword HCW1 of a code matrix is configured with a soft input of a target codeword of the first die 10A-1 that has failed in an ECC decoding process, and a third horizontal codeword HCW3 of the code matrix is configured with a soft input of a reference codeword of the third die 10A-3 that has failed in an ECC decoding process. In addition, the remaining horizontal codewords of the code matrix are configured with decoding results of reference codewords of the second, fourth, fifth, and sixth dies 10A-2, 10A-4, 10A-5, and 10A-6 that have succeeded in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2, a fourth vertical codeword VCW4, and a fifth vertical codeword VCW5 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include [1_u, 0, 1_r, 0, 0, 1]. Among the code bits of the second vertical codeword VCW2, code bits '0' and '1' corresponding to the decoding results are code bits having highest reliability. Accordingly, an error candidate code bit having lowest reliability may be detected by comparing items of reliability of code bits corresponding to a soft input from among the code bits of the second vertical codeword VCW2. As a result, '1_u', which is a first code bit of the code bits of the second vertical codeword VCW2, is detected as an error candidate code bit having lowest reliability.

In the same manner, '0_u', which is a first code bit of code bits [0_u, 0, 0_r, 1, 1, 1] of the fourth vertical codeword VCW4 in which a code constraint condition is not satisfied, is detected as an error candidate code bit having lowest reliability. In addition, third and fifth code bits of code bits [0_r, 1, 0_r, 0, 1, 1] of the fifth vertical codeword VCW5 in which a code constraint condition is not satisfied are error candidate code bits having lowest reliability. In this manner, when a plurality of code bits having lowest reliability are detected in a vertical codeword in which a code constraint condition is not satisfied, it is determined that an error candidate code bit is not detected in the corresponding vertical codeword. Accordingly, it is determined that an error candidate code bit is not detected in the fifth vertical codeword VCW5.

When a soft input of a target codeword includes an error candidate code bit detected in this manner, the recovery module 21 performs an operation process of inverting a sign bit of the corresponding error candidate code bit. That is, second and fourth code bits CB2 and CB4 of code bits of the first horizontal codeword HCW1 of the code matrix are error candidate code bits. Accordingly, sign bits of the second and fourth code bits CB2 and CB4 of the first horizontal codeword HCW1 are inverted. That is, '1_u' that is the second code bit CB2 is changed to '0_u', and '0_u' that is the fourth code bit CB4 is changed to '1_u'.

Accordingly, the first horizontal codeword HCW1 is changed from [0_r, 1_u, 1_u, 0_u, 0_r, 1_u] to [0_r, 0_u, 1_u, 1_u, 0_r, 1_u]. The recovery module 21 outputs a horizontal codeword HCW1_refine corrected according to the operation process described above for the ECC decoder 22 (Operation S53).

The ECC decoder 22 receives the corrected horizontal codeword HCW1_refine from the recovery module 21 and performs an ECC decoding process again on the corrected horizontal codeword HCW1_refine (Operation S54).

When data recovery for the corrected horizontal codeword HCW1_refine in the ECC decoder 22 fails, an additional soft decision read operation is performed and a data recovery process is performed by using a codeword acquired according to the additional soft decision read operation (Operation S55). For example, when an ECC decoding process for a soft input of a corrected target codeword fails, a data recovery process is performed based on a soft input acquired after an additional soft decision read operation as shown in FIG. 11 is performed. The reliability of a soft input of a corrected target codeword that has failed in an ECC decoding process is defined by {r, a}. On the other hand, the reliability of a soft input acquired after an additional soft decision read operation is performed may be more specifically defined by $\{r_2, r_1, u\}$.

Figure 20:
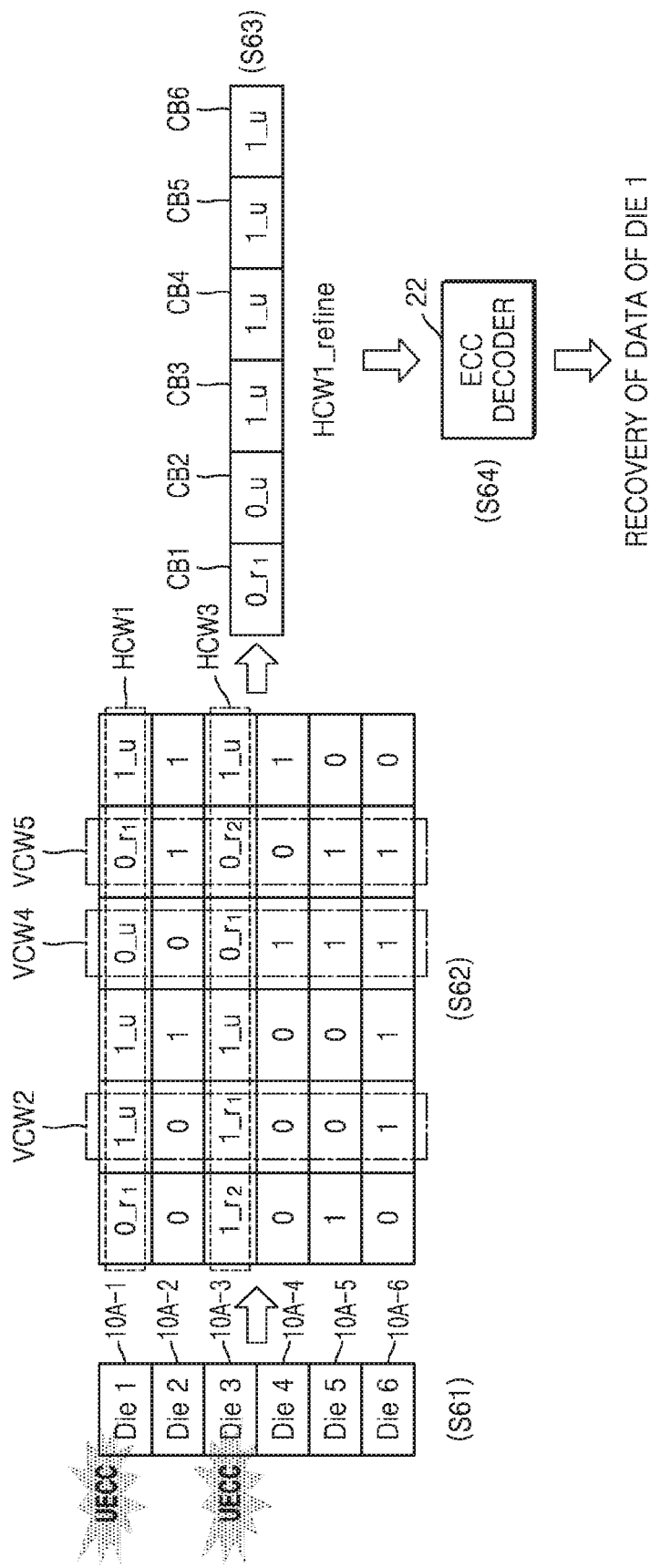
FIG. 20 is a diagram showing another example of performing a data recovery process in the memory system of FIG. 1.

FIG. 20 is a diagram showing an example of performing a data recovery process in the memory system 100 of FIG. 1.

FIG. 20 shows an example of performing a data recovery process again by using data acquired by an additional soft decision read operation when a data recovery process of a soft input according to an operation shown in FIG. 19 has failed.

The example shown in FIG. 20 is an example in which an ECC decoding process for a target codeword acquired from the first die 10A-1 through an additional soft decision read operation has failed and an ECC decoding process for a reference codeword of the third die 10A-3 has failed.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S61).

The recovery module 21 performs an operation process of correcting the target codeword by using a soft input HCW1 of a target codeword of the first die 10A-1 that has failed in an ECC decoding process, a soft input HCW3 of a reference codeword of the third die 10A-3 that has failed in an ECC decoding process, and decoding results of reference codewords of the second, fourth, fifth, and sixth dies 10A-2, 10A-4, 10A-5, and 10A-6 that have succeeded in an ECC decoding process (Operation S62).

For example, a first horizontal codeword HCW1 of a code matrix is configured with a soft input of a target codeword of the first die 10A-1 that has failed in an ECC decoding process, and a third horizontal codeword HCW3 of the code matrix is configured with a soft input of a reference codeword of the third die 10A-3 that has failed in an ECC decoding process. In addition, the remaining horizontal codewords of the code matrix are configured with decoding results of reference codewords of the second, fourth, fifth, and sixth dies 10A-2, 10A-4, 10A-5, and 10A-6 that have succeeded in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2, a fourth vertical codeword VCW4, and a fifth vertical codeword VCW5 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include $[1\_u, 0, 1\_r_1, 0, 0, 1]$. Among the code bits of the second vertical codeword VCW2, code bits '0' and '1' corresponding to the decoding results are code bits having highest reliability. Accordingly, an error candidate code bit having lowest reliability may be detected by comparing items of reliability of code bits corresponding to a soft input from among the code bits of the second vertical codeword VCW2. As a result, '1_u', which is a first code bit of the code bits of the second vertical codeword VCW2, is detected as an error candidate code bit having lowest reliability.

In the same manner, '0_u', which is a first code bit of code bits $[0\_u, 0, 0\_r_1, 1, 1, 1]$ of the fourth vertical codeword VCW4 in which a code constraint condition is not satisfied, is detected as an error candidate code bit having lowest reliability. In addition, '$0\_r_1$' corresponding to a first code bit of code bits $[0\_r_1, 1, 0\_r_2, 0, 1, 1]$ of the fifth vertical codeword VCW5 in which a code constraint condition is not satisfied is detected as an error candidate code bit having lowest reliability.

When a soft input of a target codeword includes an error candidate code bit detected in this manner, the recovery module 21 performs an operation process of inverting a sign bit of the corresponding error candidate code bit. That is, second, fourth, and fifth code bits CB2, CB4, and CB5 of code bits of the first horizontal codeword HCW1 of the code matrix are error candidate code bits. Accordingly, sign bits of the second, fourth, and fifth code bits CB2, CB4, and CB5 of the first horizontal codeword HCW1 are inverted. That is, '1_u' that is the second code bit CB2 is changed to '0_u', '0_u' that is the fourth code bit CB4 is changed to '1_u', and '$0\_r_1$' that is the fifth code bit CB5 is changed to '1_u'. For example, in the case of inverting a sign bit of a code bit whose reliability is '$r_1$' or '$r_2$', the reliability is changed to 'u'.

Accordingly, the first horizontal codeword HCW1 is changed from $[0\_r_1, 1\_u, 1\_u, 0\_u, 0\_r_1, 1\_u]$ to $[0\_r_1, 0\_u, 1\_u, 1\_u, 1\_u, 1\_u]$. The recovery module 21 outputs a horizontal codeword HCW1_refine corrected according to the operation process described above for the ECC decoder 22 (Operation S63).

The ECC decoder 22 receives the corrected horizontal codeword HCW1_refine from the recovery module 21 and recovers a target codeword by performing an ECC decoding process again on the corrected horizontal codeword HCW1_refine (Operation S64). Accordingly, a recovery process for a target codeword acquired by an additional soft decision read operation may be performed.

Figure 21:
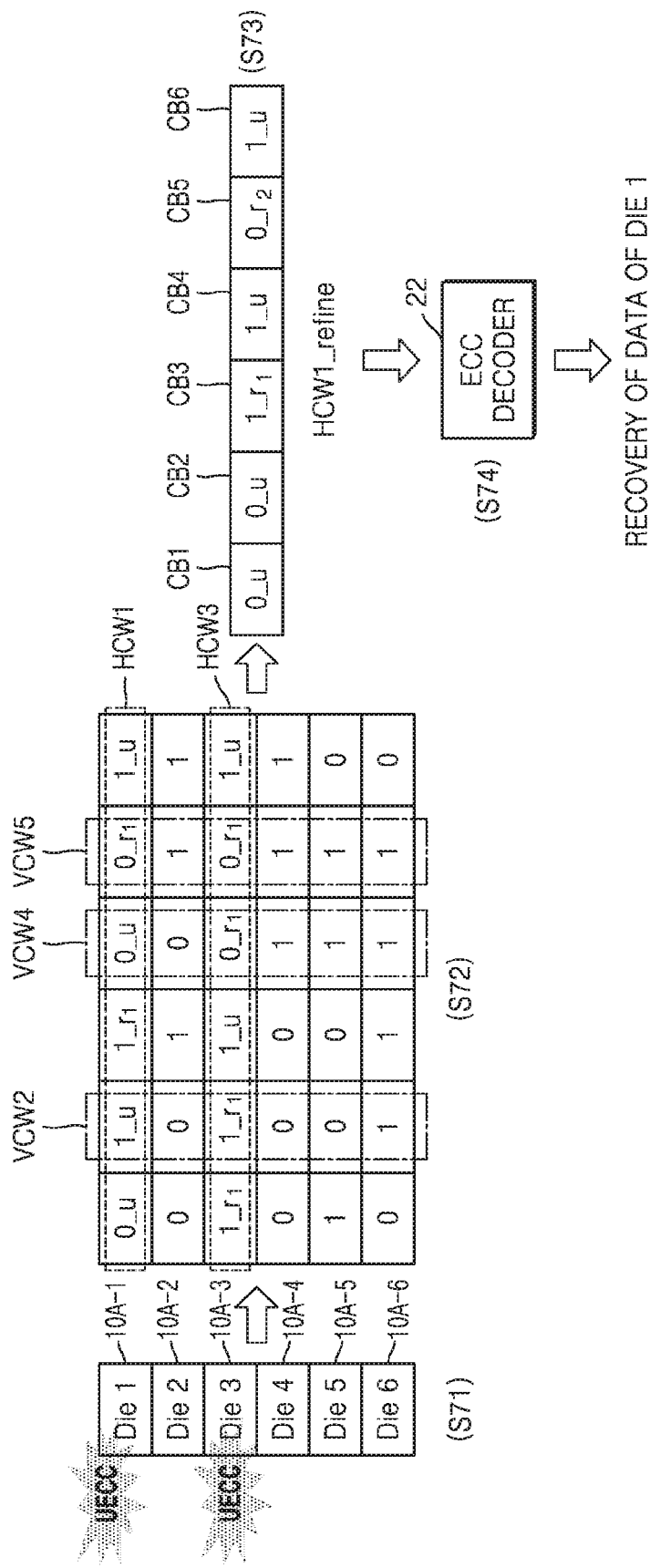
FIG. 21 is a diagram showing another example of performing a data recovery process in the memory system of FIG. 1.

FIG. 21 is a diagram showing an example of performing a data recovery process in the memory system 100 of FIG. 1.

FIG. 21 shows an example of performing an operation of correcting a reliability bit on vertical codewords of a code matrix in which a code constraint condition is satisfied, as well as an operation of correcting a sign bit on vertical codewords of the code matrix in which a code constraint condition is not satisfied.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S71).

The recovery module 21 performs an operation process of correcting the target codeword by using a soft input HCW1 of a target codeword of the first die 10A-1 that has failed in an ECC decoding process, a soft input HCW3 of a reference codeword of the third die 10A-3 that has failed in an ECC decoding process, and decoding results of reference codewords of the second, fourth, fifth, and sixth dies 10A-2, 10A-4, 10A-5, and 10A-6 that have succeeded in an ECC decoding process (Operation S72).

For example, a first horizontal codeword HCW1 of a code matrix is configured with a soft input of a target codeword of the first die 10A-1 that has failed in an ECC decoding process, and a third horizontal codeword HCW3 of the code matrix is configured with a soft input of a reference codeword of the third die 10A-3 that has failed in an ECC decoding process. In addition, the remaining horizontal codewords of the code matrix are configured with decoding results of reference codewords of the second, fourth, fifth, and sixth dies 10A-2, 10A-4, 10A-5, and 10A-6 that have succeeded in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2 and a fourth vertical codeword VCW4 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include [1_u, 0, 1_$r_1$, 0, 0, 1]. Among the code bits of the second vertical codeword VCW2, code bits '0' and '1' corresponding to the decoding results are code bits having highest reliability. Accordingly, an error candidate code bit having lowest reliability may be detected by comparing items of reliability of code bits corresponding to a soft input from among the code bits of the second vertical codeword VCW2. As a result, '1_u', which is a first code bit of the code bits of the second vertical codeword VCW2, is detected as an error candidate code bit having lowest reliability. In the same manner, '0_u', which is a first code bit of code bits [0_u, 0, 0_$r_1$, 1, 1, 1] of the fourth vertical codeword VCW4 in which a code constraint condition is not satisfied, is detected as an error candidate code bit having lowest reliability.

When a soft input of a target codeword includes an error candidate code bit detected in this manner, the recovery module 21 performs an operation process of inverting a sign bit of the corresponding error candidate code bit. That is, second and fourth code bits CB2 and CB4 of code bits of the first horizontal codeword HCW1 of the code matrix are error candidate code bits. Accordingly, sign bits of the second and fourth code bits CB2 and CB4 of the first horizontal codeword HCW1 are inverted. That is, '1_u' that is the second code bit CB2 is changed to '0_u', and '0_u' that is the fourth code bit CB4 is changed to '1_u'.

Additionally, the recovery module 21 performs an operation of correcting a reliability bit on vertical codewords in which a code constraint condition is satisfied. For example, when the reliability of a soft input of code bits of a vertical codeword in which a code constraint condition is satisfied is [r1, r1], the reliability may be changed from r1 to r2. That is, since reliabilities of a first code bit '0_$r_1$' and a third code bit '0_$r_1$', which correspond to a soft input in the fifth vertical codeword VCW5 [0_$r_1$, 1, 0_$r_1$, 1, 1, 1] in which a code constraint condition is satisfied, are r1, the first code bit '0_$r_1$' may be changed to '0_$r_2$' to increase reliability. Accordingly, a fifth code bit CB5 of the first horizontal codeword HCW1 may be changed from '0_$r_1$' to '0_$r_2$'. As another example, a table may be initially set with respect to a condition that may change the reliability of a soft input in a vertical codeword in which a code constraint condition is satisfied, and the reliability of the soft input may be changed based on the table.

Accordingly, the first horizontal codeword HCW1 is changed from [0_u, 1_u, 1_$r_1$, 0_u, 0_$r_1$, 1_u] to [0_u, 0_u, 1_$r_1$, 1_u, 0_$r_2$, 1_u]. The recovery module 21 outputs a horizontal codeword HCW1_refine corrected according to the operation process described above for the ECC decoder 22 (Operation S73).

The ECC decoder 22 receives the corrected horizontal codeword HCW1_refine from the recovery module 21 and recovers a target codeword by performing an ECC decoding process again on the corrected horizontal codeword HCW1_refine (Operation S74).

Figure 22A:
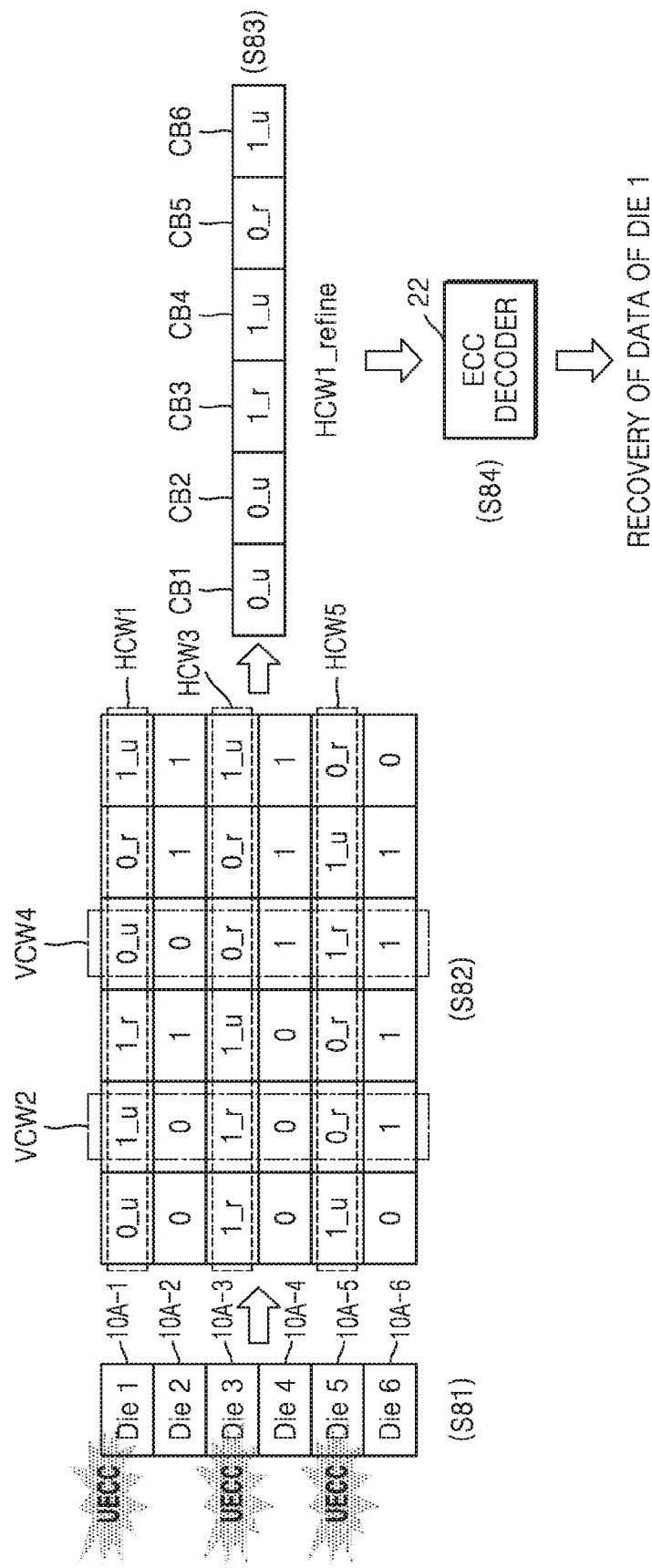

FIGS. 22A and 22B are diagrams showing other examples of performing a data recovery process in the memory system 100 of FIG. 1.

FIG. 22A shows an example in which an ECC decoding process for a target codeword of the first die 10A-1 has failed and an ECC decoding process for reference codewords of the third and fifth dies 10A-3 and 10A-5 has failed.

When an ECC decoding process for a target codeword, performed in the memory system 100, fails, an operation of reading reference codewords, which have code correlation with the target codeword, from a plurality of dies, i.e., the first to sixth dies 10A-1 to 10A-6, is performed (Operation S81).

The recovery module 21 performs an operation process of correcting the target codeword by using a soft input HCW1 of a target codeword of the first die 10A-1 that has failed in an ECC decoding process, soft inputs HCW3 and HCW5 of reference codewords of the third and fifth dies 10A-3 and 10A-5 that have failed in an ECC decoding process, and decoding results of reference codewords of the second, fourth, and sixth dies 10A-2, 10A-4, and 10A-6 that have succeeded in an ECC decoding process (Operation S82).

For example, a first horizontal codeword HCW1 of a code matrix may be configured with a soft input of a target codeword of the first die 10A-1 that has failed in an ECC decoding process, a third horizontal codeword HCW3 of the code matrix may be configured with a soft input of a reference codeword of the third die 10A-3 that has failed in an ECC decoding process, and a fifth horizontal codeword HCW5 of the code matrix may be configured with a soft input of a reference codeword of the fifth die 10A-5 that has failed in an ECC decoding process.

The recovery module 21 detects vertical codewords, in which a code constraint condition is not satisfied, from the code matrix configured in this manner. For example, vertical codewords for which even parity is not satisfied are detected. Accordingly, a second vertical codeword VCW2 and a fourth vertical codeword VCW4 for which even parity is not satisfied are detected from the code matrix.

The recovery module 21 detects an error candidate code bit having lowest reliability in vertical codeword units from the vertical codewords in which a code constraint condition is not satisfied. Code bits of the second vertical codeword VCW2, in which a code constraint condition is not satisfied, include [1_u, 0, 1_r, 0, 0_r, 1]. Among the code bits of the second vertical codeword VCW2, code bits '0' and '1' corresponding to the decoding results are code bits having highest reliability. Accordingly, an error candidate code bit having lowest reliability may be detected by comparing items of reliability of code bits corresponding to a soft input from among the code bits of the second vertical codeword VCW2. As a result, '1_u', which is a first code bit of the code bits of the second vertical codeword VCW2, is detected as an error candidate code bit having lowest reliability. In the same manner, '0_u', which is a first code bit of code bits [0_u, 0, 0_r, 1, 1_r, 1] of the fourth vertical codeword VCW4 in which a code constraint condition is not satisfied, is detected as an error candidate code bit having lowest reliability.

When a soft input of a target codeword includes an error candidate code bit detected in this manner, the recovery module 21 performs an operation process of inverting a sign bit of the corresponding error candidate code bit. That is, second and fourth code bits CB2 and CB4 of code bits of the first horizontal codeword HCW1 of the code matrix are error candidate code bits. Accordingly, sign bits of the second and fourth code bits CB2 and CB4 of the first horizontal codeword HCW1 are inverted. That is, '1_u' that is the second code bit CB2 is changed to '0_u', and '0_u' that is the fourth code bit CB4 is changed to '1_u'.

Accordingly, the first horizontal codeword HCW1 is changed from [0_u, 1_u, 1_r, 0_u, 0_r, 1_u] to [0_u, 0_u, 1_r, 1_u, 0_r, 1_u]. The recovery module 21 outputs a horizontal codeword HCW1_refine corrected according to the operation process described above for the ECC decoder 22 (Operation S83).

The ECC decoder 22 receives the corrected horizontal codeword HCW1_refine from the recovery module 21 and recovers a target codeword by performing an ECC decoding process again on the corrected horizontal codeword HCW1_refine (Operation S84). In this regard, since the corrected horizontal codeword HCW1_refine corresponds to a soft input of a corrected target codeword, the target codeword may be recovered by performing an ECC decoding process again on a soft input of a corrected target codeword of the first die 10A-1.

FIG. 22B shows an example of performing a recovery process on a reference codeword of the third die 10A-3, which has failed in an ECC decoding process, by using a decoding result of a target codeword of the first die 10A-1 recovered in the example of FIG. 22.

FIG. 22B shows a state in which the first die 10A-1 has succeeded in an ECC decoding process for a corrected target codeword and the third and fifth dies 10A-3 and 10A-5 have failed in an ECC decoding process for a reference codeword.

The recovery module 21 performs an operation process of correcting a reference codeword of the third die 10A-3 by using a decoding result HCW1 of a corrected target codeword of the first die 10A-1 that has succeeded in an ECC decoding process, soft inputs HCW3 and HCW5 of reference codewords of the third and fifth dies 10A-3 and 10A-5 that have failed in an ECC decoding process, and decoding results of reference codewords of the second, fourth, and sixth dies 10A-2, 10A-4, and 10A-6 that have succeeded in an ECC decoding process (Operation S85).

For example, a first horizontal codeword HCW1 of a code matrix may be configured with a decoding result of a corrected target codeword of the first die 10A-1 that has succeeded in an ECC decoding process, a third horizontal codeword HCW3 of the code matrix may be configured with a soft input of a reference codeword of the third die 10A-3 that has failed in an ECC decoding process, and a fifth horizontal codeword HCW5 of the code matrix may be configured with a soft input of a reference codeword of the fifth die 10A-5 that has failed in an ECC decoding process.

The recovery module 21 detects vertical codewords, in which a code constraint condition is not satisfied, from the code matrix configured in this manner. For example, vertical codewords for which even parity is not satisfied are detected. Accordingly, a first vertical codeword VCW1 and a sixth vertical codeword VCW6 for which even parity is not satisfied are detected from the code matrix.

The recovery module 21 detects an error candidate code bit having lowest reliability in vertical codeword units from the vertical codewords in which a code constraint condition is not satisfied. Code bits of the first vertical codeword VCW1 in which a code constraint condition is not satisfied include [1, 0, 1_r, 0, 1_u, 0]. Among the code bits of the first vertical codeword VCW1, code bits '0' and '1' corresponding to the decoding results are code bits having highest reliability. Accordingly, an error candidate code bit having lowest reliability may be detected by comparing items of reliability of code bits corresponding to a soft input from among the code bits of the first vertical codeword VCW1. As a result, '1_u', which is a fifth code bit of the code bits of the first vertical codeword VCW1, is detected as an error candidate code bit having lowest reliability. In the same manner, '0_u', which is a third code bit of code bits [0, 1, 0_u, 1, 0_r, 0] of the sixth vertical codeword VCW6 in which a code constraint condition is not satisfied, is detected as an error candidate code bit having lowest reliability.

When a soft input of a third horizontal codeword HCW3 corresponding to a reference codeword of the third die 10A-3 to be recovered includes an error candidate code bit detected in this manner, the recovery module 21 performs an operation process of inverting a sign bit of the corresponding error candidate code bit. That is, a sixth code bit CB6 of code bits of the third horizontal codeword HCW3 of the code matrix is an error candidate code bit. Accordingly, a sign bit of the sixth code bit CB6 of the third horizontal codeword HCW3 is inverted. That is, '1_u' that is the sixth code bit CB6 is changed to '0_u'.

Accordingly, the third horizontal codeword HCW3 is changed from [1_r, 1_r, 1_u, 0_r, 0_r, 1_u] to [1_r, 1_r, 1_u, 0_r, 0_r, 0_u]. The recovery module 21 outputs a horizontal codeword HCW3_refine corrected according to the operation process described above for the ECC decoder 22 (Operation S86).

The ECC decoder 22 receives the corrected horizontal codeword HCW3_refine from the recovery module 21 and recovers a reference codeword of the third die 10A-3 by performing an ECC decoding process again on the corrected horizontal codeword HCW3_refine (Operation S87). In this regard, since the corrected horizontal codeword HCW3_refine corresponds to a soft input of a corrected reference codeword of the third die 10A-3, the reference codeword may be recovered by performing an ECC decoding process again on the soft input of the corrected reference codeword of the third die 10A-3.

Figure 23:
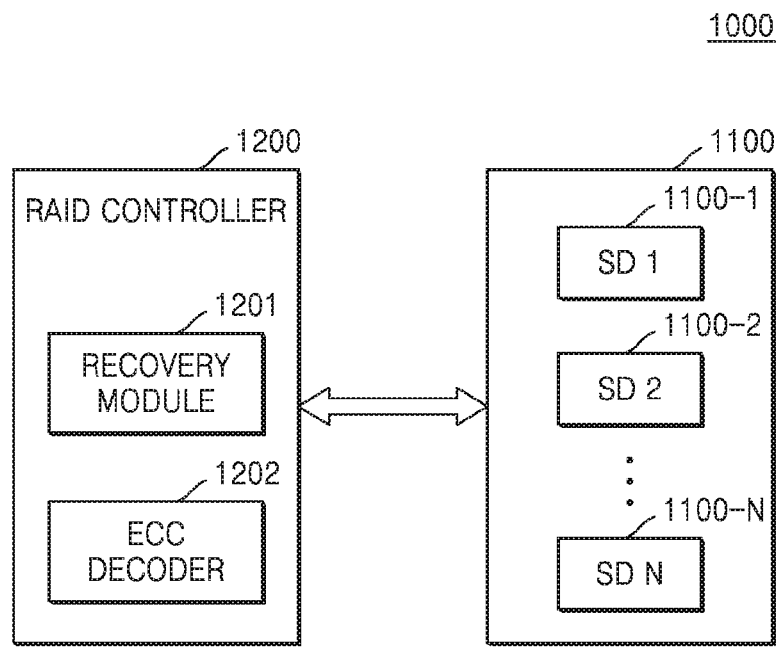
FIG. 23 is a block diagram of a redundant array of inexpensive disks (RAID) storage system according to an embodiment.

FIG. 23 is a block diagram of a RAID storage system 1000 according to an embodiment.

Referring to FIG. 23, the RAID storage system 1000 includes a plurality of storage devices 1100 and a RAID controller 1200.

The plurality of storage devices 1100 include N storage devices 1100-1 to 1100-N (where N is an integer that is equal to or greater than 2). Each of the storage device 1100-1 to 1100-N may be implemented with a solid state drive (SSD) or a hard disk drive.

The RAID controller 1200 controls the storage devices 1100-1 to 1100-N based on stripe mapping information.

The RAID controller 1200 may generate a multi-dimensional code based on data received in stripe units from the storage devices 1100-1 to 1100-N. For example, a stripe according to a RAID method may be used.

The RAID controller 1200 includes a recovery module 1201 and an ECC decoder 1202.

When an ECC decoding process for codewords read from two or more storage devices, which form the same stripe, from among the plurality of storage devices 1100-1 to 1100-N fails, the recovery module 1201 corrects a soft input of a codeword that has failed in an ECC decoding process, based on an operation process according to code correlation by using a soft input, which is received from storage devices that have failed in an ECC decoding process, and decoding results which are received from storage devices that have succeeded in an ECC decoding process.

When an ECC decoding process for a target codeword fails, the recovery module 1201 may generate a corrected target codeword based an operation process according to code correlation which uses reference codewords having code correlation with the target codeword and a target codeword that has failed in the ECC decoding process. The reference codewords may include codewords read from the storage devices 1100-1 to 1100-N which form the same stripe as the target codeword.

The recovery module 1201 may detect a candidate codeword, which does not satisfy a code constraint condition, from a code matrix including a decoding result of a reference codeword, a soft input of a reference codeword, and a soft input of the target codeword, and may correct the target codeword based on reliability of code bits included in the candidate codeword.

An operation method in which a corrected target codeword is generated by the recovery module 1201 is substantially the same as that in the recovery module 21 of FIG. 1, and thus, its repeated descriptions are not provided.

The ECC decoder 1202 performs an error detection and correction process on an input of a corrected target codeword or corrected reference codeword generated by the recovery module 1201. For example, an error correction process may be performed by using an LDPC code, a BCH code, a turbo code, and a convolution code.

Figure 24:
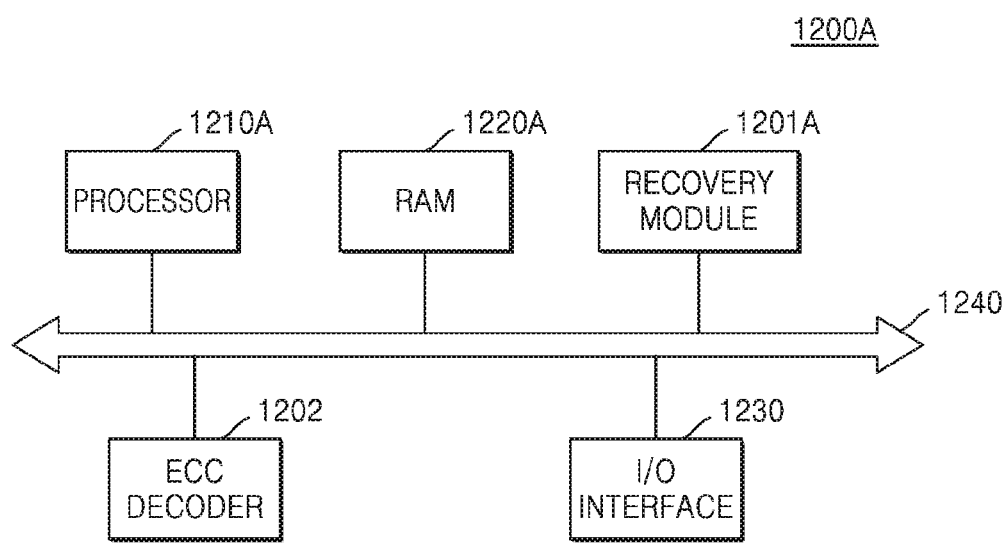
FIG. 24 is a block diagram of a RAID controller that is an example of a RAID controller illustrated in FIG. 23.

FIG. 24 is a block diagram of a RAID controller 1200A that is an example of the RAID controller 1200 illustrated in FIG. 23.

As illustrated in FIG. 24, the RAID controller 1200A may include a processor 1210A, a recovery module 1201A, an ECC decoder 1202, RAM 1220A, an input/output (I/O) interface 1230, and a bus 1240.

The components of the memory controller 1200A may be electrically connected to each other through the bus 1240.

The processor 1210A may control all operations of the RAID storage system 1000 by using a program code and data stored in the RAM 1220A. For example, the processor 1210A may be implemented with a microprocessor or a CPU. When the RAID storage system 1000 is initialized, the processor 1210A may read, from the storage devices 1100-1 to 1100-N, a program code and data necessary for controlling operations which are performed in the RAID storage system 1000, and may load the program code and the data into the RAM 1220A.

The processor 1210A may perform operations necessary for data recovery according to flowcharts illustrated in FIGS. 27 to 35 by using system data stored in the RAM 1220A.

When an ECC decoding process for a target codeword fails, the recovery module 1201A performs an operation process of generating a corrected target codeword to recover data that has failed in the ECC decoding process. For example, the recovery module 1201A may be implemented with a hardware logic circuit. The ECC decoder 1202 performs an error detection and correction process on an input of a corrected target codeword or corrected reference codeword generated by the recovery module 1201A.

The I/O interface 1230 is connected to I/O devices in order to transmit or receive data to or from the I/O devices. For example, data may be transmitted to the storage devices 1100-1 to 1100-N connected to the I/O interface 1230 or received from the storage devices 1100-1 to 1100-N.

Figure 25:
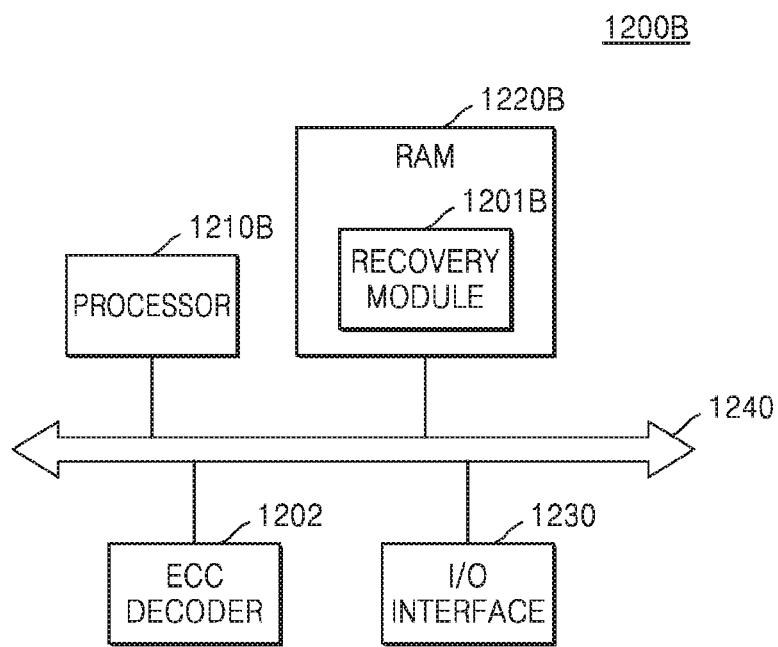
FIG. 25 is a block diagram of a RAID controller that is another example of the RAID controller illustrated in FIG. 23.

FIG. 25 is a block diagram of a RAID controller 1200B that is another example of the RAID controller 1200 illustrated in FIG. 23.

As illustrated in FIG. 25, the RAID controller 1200B may include a processor 1210B, an ECC decoder 1202, RAM 1220B, an I/O interface 1230, and a bus 1240.

A program code and data necessary for controlling operations which are performed in the RAID storage system 1000 may be stored in the RAM 1220B. For example, when the RAID storage system 1000 is initialized, the processor 1210B may read, from the storage devices 1100-1 to 1100-N, the program code and the data necessary for controlling the operations which are performed in the RAID storage system 1000, and may load the program code and the data into the RAM 1220B. In addition, the RAM 1220B may store a program code of a recovery module 1201B which is implemented with software.

The processor 1210B may control all operations of the RAID storage system 1000 by using the program code and the data stored in the RAM 1220B. For example, the processor 1210B may perform a data recovery process on data, which has failed in an ECC decoding process as described above, by using the program code of the recovery module 1201B stored in the RAM 1220B.

The ECC decoder 1202, the I/O interface 1230, and the bus 1240 have been described above with reference to FIG. 24, and thus, their repeated descriptions are not provided.

Figure 26:
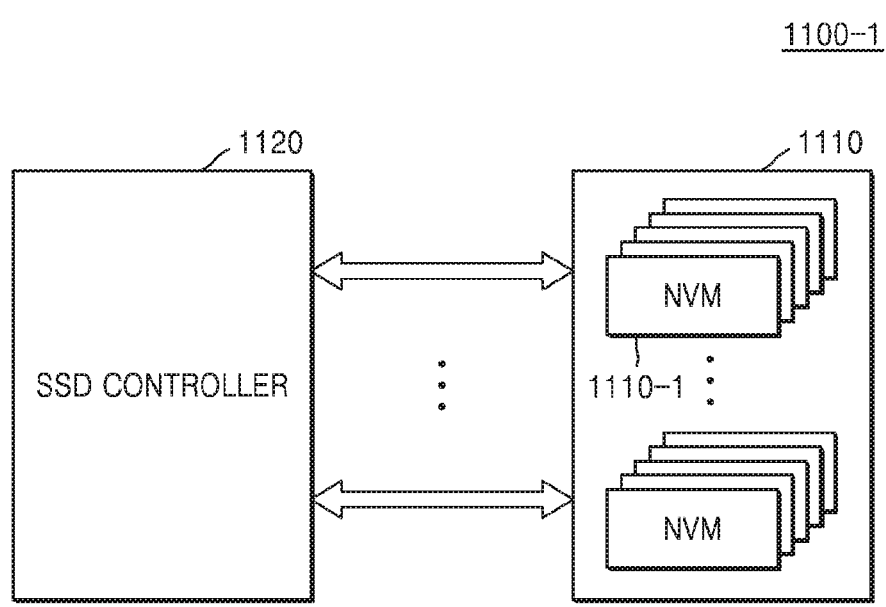
FIG. 26 is a diagram showing a configuration of a storage device illustrated in FIG. 23.

FIG. 26 is a diagram showing a configuration of a storage device 1100-1 included in the RAID storage system 1000 of FIG. 23.

As illustrated in FIG. 26, the storage device 1100-1 includes a memory device 1110 and an SSD controller 1120.

The memory device 1110 may include a plurality of non-volatile memory (NVM) devices 1110-1. For example, the memory device 1110 may include a flash memory device, a PRAM device, an FRAM device, and/or an MRAM device.

The SSD controller 1120 may control the memory device 1110. The SSD controller 1120 may generate an address ADDR, a command CMD, and a control signal CTRL to control the memory device 1110. The SSD controller 1120 may control program (or write), read, and erase operations of the memory device 1110 by providing the address ADDR, the command CMD, and the control signal CTRL to the memory device 1110.

The SSD controller 1120 performs an ECC decoding process on data read from the memory device 1110 according to the request of the RAID controller 1200. When the ECC decoding process succeeds, the SSD controller 1120 transmits an ECC decoding result to the RAID controller 1200. When the ECC decoding process fails, the SSD controller 1120 transmits a soft input of data, which has failed in the ECC decoding process, to the RAID controller 1200.

Methods of recovering data in various types of systems including the memory system 100 shown in FIG. 1 or the RAID storage system 1000 shown in FIG. 23 will be described with reference to flowcharts of FIGS. 27 to 35.

Figure 27:
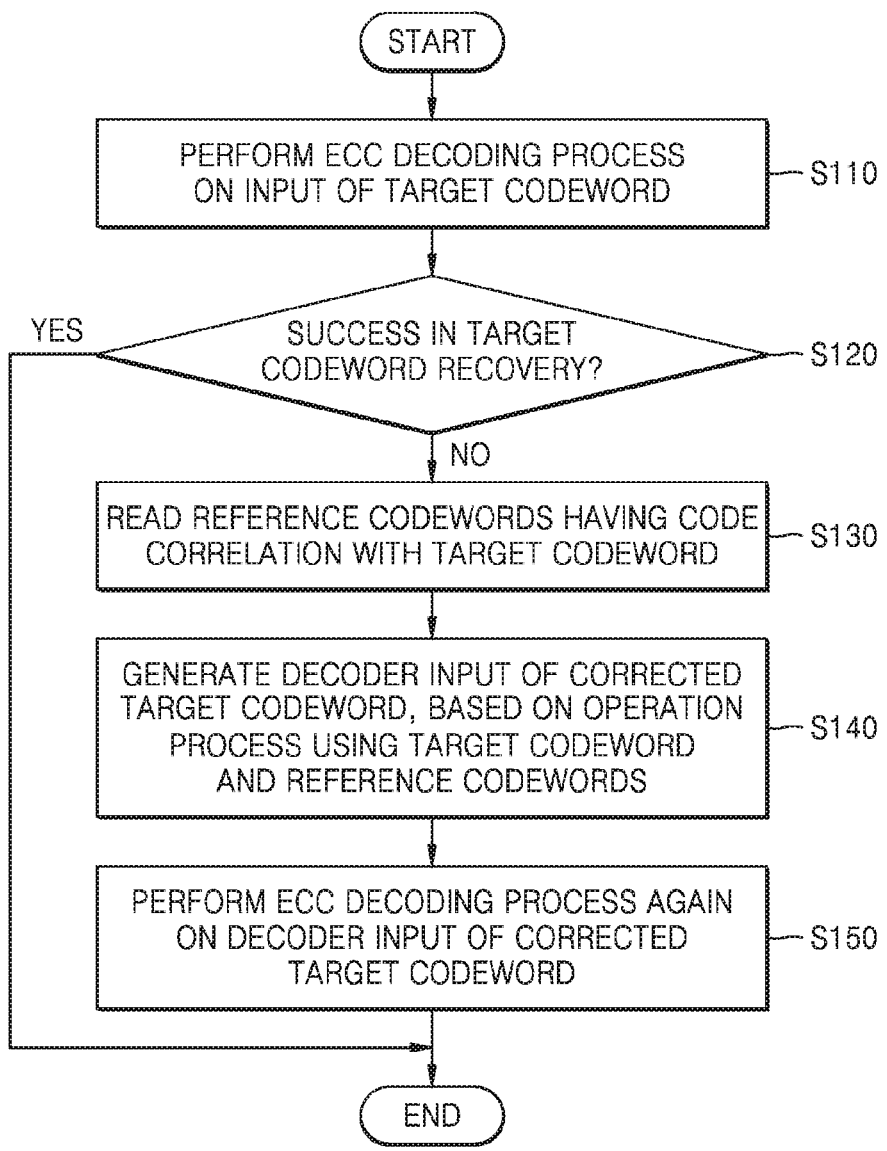
FIG. 27 is a flowchart of a method of recovering data, according to an embodiment.

FIG. 27 is a flowchart of a method of recovering data, according to an embodiment.

Referring to FIG. 27, a system performs an ECC decoding process on an input of a target codeword (Operation S110). For example, the target codeword may be chunk data requested by a host.

Next, the system determines whether a target codeword recovery according to the ECC decoding process has succeeded (Operation S120). In other words, the system determines whether the ECC decoding process for an input of the target codeword has succeeded.

When it is determined that the ECC decoding process for an input of the target codeword has failed, the system reads reference codewords having code correlation with the target codeword (Operation S130). For example, the reference codewords may be read from a storage region of a memory device which forms the same stripe as the target codeword.

The system generates a decoder input of a corrected target codeword, based on an operation process using the target codeword and the reference codewords (Operation S140). For example, an operation of correcting the target codeword may be performed by the recovery module 21 of FIG. 1 and the recovery module 1201 of FIG. 21.

Next, the system performs an ECC decoding process again on the decoder input of the corrected target codeword (Operation S150).

Figure 28:
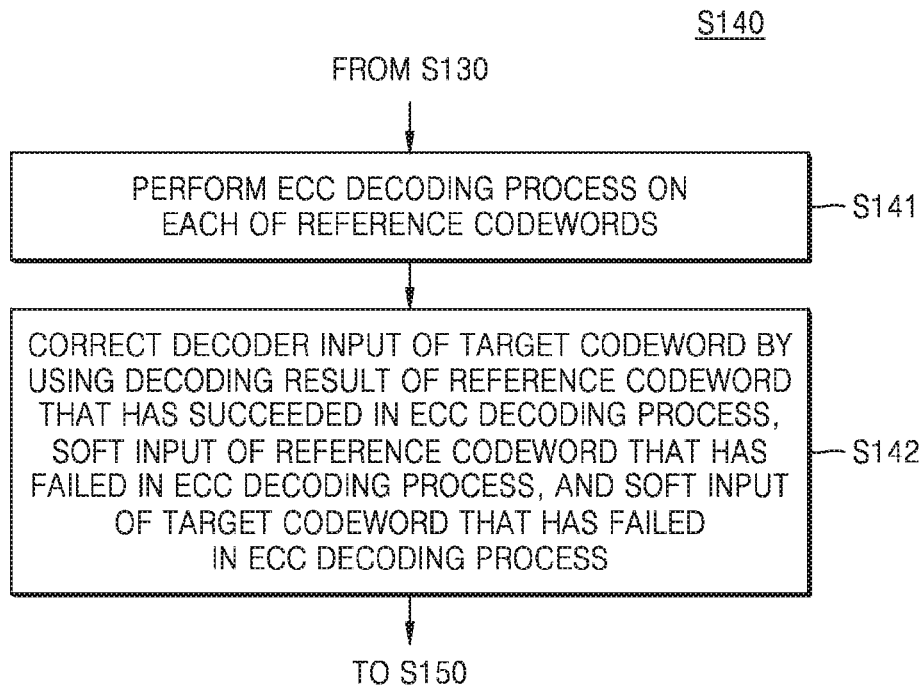
FIG. 28 is a flowchart of an operation of correcting a target codeword, illustrated in FIG. 27.

FIG. 28 is a flowchart of Operation S140 of correcting the target codeword, illustrated in FIG. 27.

Referring to FIG. 28, the system performs an ECC decoding process on each of the read reference codewords after completing Operation S130 (Operation S141).

Next, the system corrects a decoder input of the target codeword, based on an operation process according to code correlation, by using a decoding result of a reference codeword that has succeeded in the ECC decoding process, a soft input of a reference codeword that has failed in the ECC decoding process, and a soft input of a target codeword that has failed in the ECC decoding process (operation S142).

For example, the system may perform Operation S142 when an ECC decoding process for at least one of the reference codewords fails, and may recover the target codeword by using decoding results of the reference codewords when an ECC decoding process for all of the reference codewords succeeds.

Figure 29:
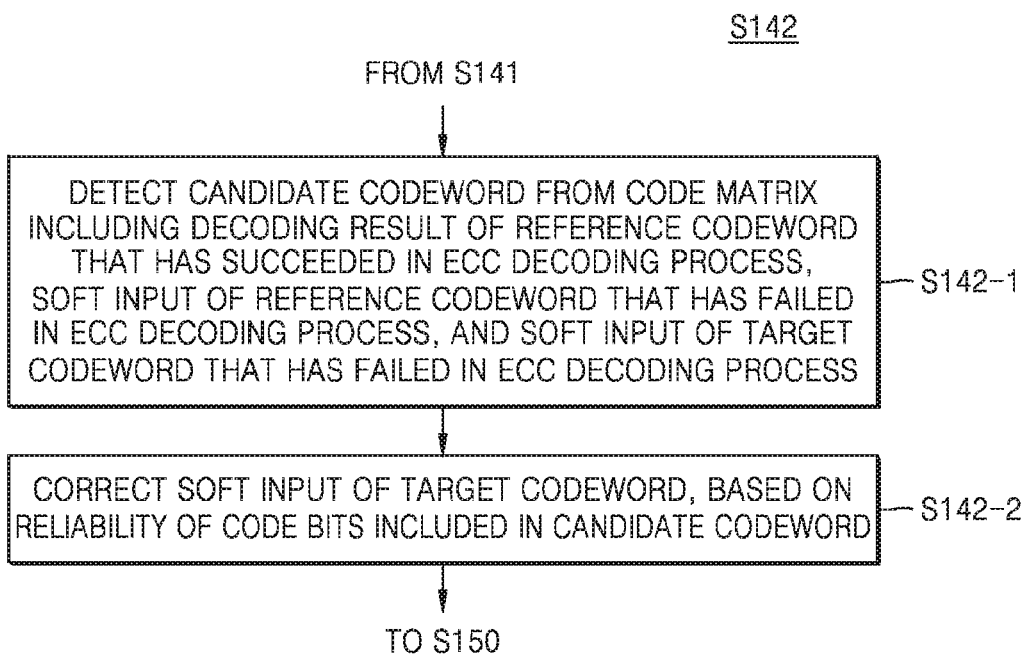
FIG. 29 is a flowchart of an operation of generating a decoder input of a corrected target codeword, illustrated in FIG. 28.

FIG. 29 is a flowchart of Operation S142 of generating a decoder input of a corrected target codeword, illustrated in FIG. 28.

After completing Operation S141, the system detects a candidate codeword, which does not satisfy a code constraint condition, from a code matrix including a decoding result of a reference codeword that has succeeded in the ECC decoding process, a soft input of a reference codeword that has failed in the ECC decoding process, and a soft input of a target codeword that has failed in the ECC decoding process (Operation S142-1). For example, the code matrix may be configured based on a multi-dimensional code, as shown in FIG. 2. In addition, the candidate codeword may be detected by a method as described above with reference to FIGS. 15 to 22.

The system corrects the soft input of the target codeword, based on reliability of code bits included in the detected candidate codeword (operation S142-2).

Figure 30:
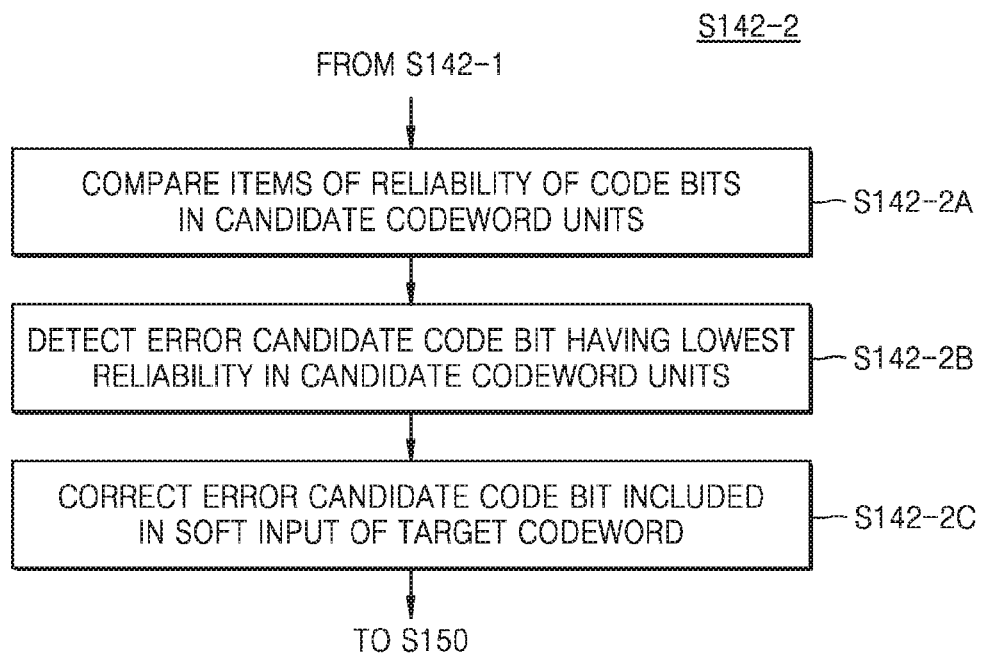
FIG. 30 is a flowchart of an operation of correcting a soft input of a corrected target codeword, illustrated in FIG. 29.

FIG. 30 is a flowchart of Operation S142-2 of correcting a soft input of the corrected target codeword, illustrated in FIG. 29.

The system compares items of reliability of code bits in detected candidate codeword units after completing Operation S142-1 (Operation S142-2A).

The system detects an error candidate code bit having lowest reliability in candidate codeword units, based on a comparison result (Operation S142-2B). For example, the system may detect an error candidate code bit having lowest reliability by using a reliability bit included in a soft input of the candidate codeword. For example, the system may determine that an error candidate code bit is not detected in a candidate codeword in which there are a plurality of code bits having lowest reliability.

The system corrects an error candidate code bit included in a soft input of the target codeword (Operation S142-2C). For example, the system may generate a corrected target codeword by using a method of inverting a sign bit of an error candidate code bit included in a soft input of the target codeword.

Figure 31:
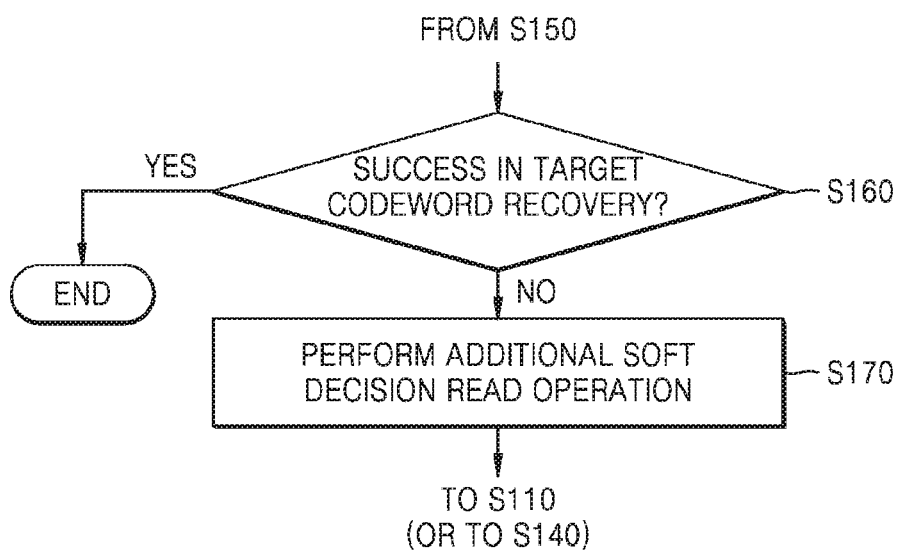
FIG. 31 is a flowchart showing operations that may be added to the flowchart of FIG. 27.

FIG. 31 is a flowchart showing operations that may be added to the flowchart of FIG. 27.

After completing Operation S150, the system determines whether a target codeword recovery has succeeded (Operation S160). In other words, the system determines whether an ECC decoding process for an input of a corrected target codeword has succeeded.

When it is determined that the ECC decoding process for the input of the corrected target codeword has failed, the system performs an additional soft decision read operation (Operation S170). For example, when a soft input of a target codeword is acquired based on a soft decision read operation as shown in FIG. 10, an additional soft decision read operation as shown in FIG. 11 may be performed to subdivide the division of reliability by a reliability bit.

The system performs Operation S110 or Operation S140 after completing Operation S170 of performing the additional soft decision read operation.

Figure 32:
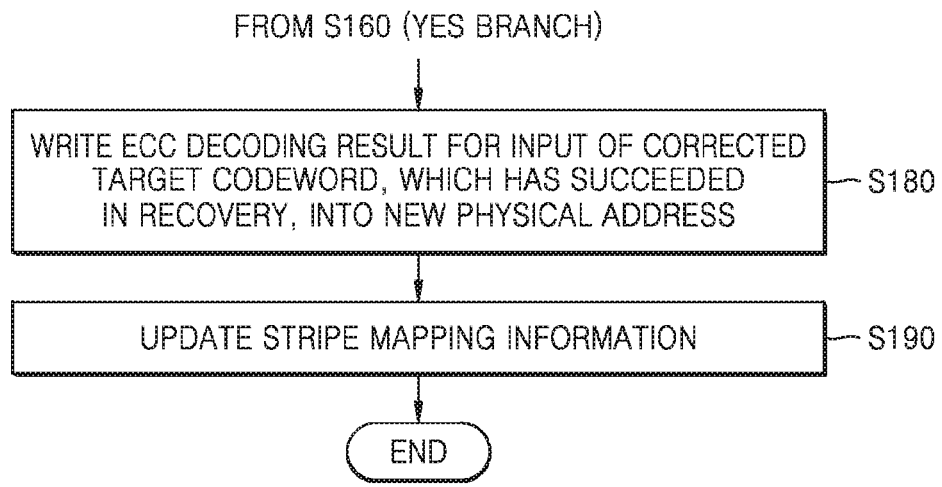
FIG. 32 is a flowchart showing operations that may be added to the flowchart of FIG. 31.

FIG. 32 is a flowchart showing operations that may be added to the flowchart of FIG. 31.

When in Operation S160, it is determined that an ECC decoding process for an input of a corrected target codeword has succeeded, the system writes an ECC decoding result for the input of the corrected target codeword, which has succeeded in a recovery, into a new physical address (Operation S180).

Next, the system updates stripe mapping information based on the new physical address into which the ECC decoding result has been written (Operation S190).

Figure 33:
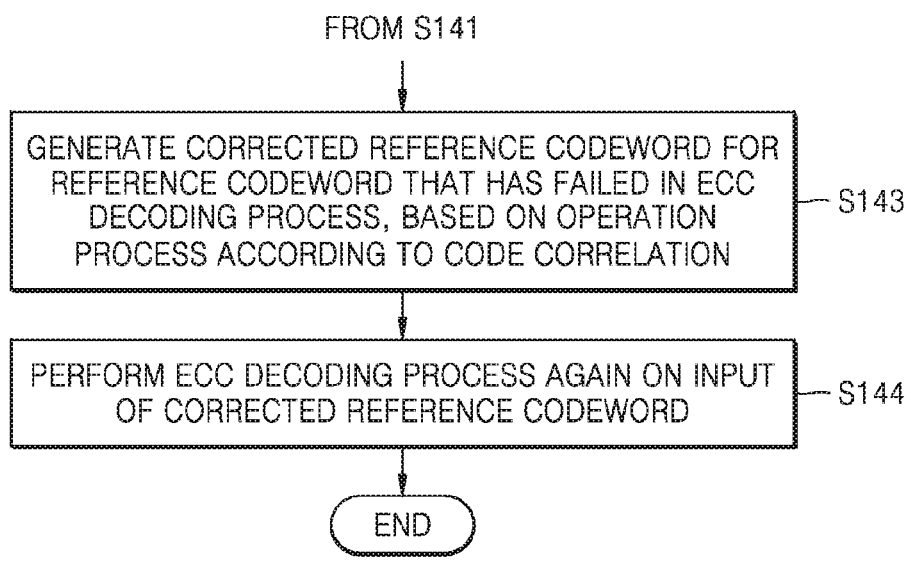
FIG. 33 is a flowchart showing operations that may be added to the flowchart of FIG. 28.

FIG. 33 is a flowchart showing operations that may be added to the flowchart of FIG. 28.

After completing Operation S141, the system generates a corrected reference codeword for a reference codeword that has failed in an ECC decoding process, based on an operation process according to code correlation (Operation S143). An operation of generating the corrected reference codeword may be performed in the same manner as an operation of generating a corrected target codeword.

The system performs an ECC decoding process again on an input of the corrected reference codeword (operation S144). Accordingly, a reference codeword that has failed in an ECC decoding process may be recovered by using the input of the corrected reference codeword.

Figure 34:
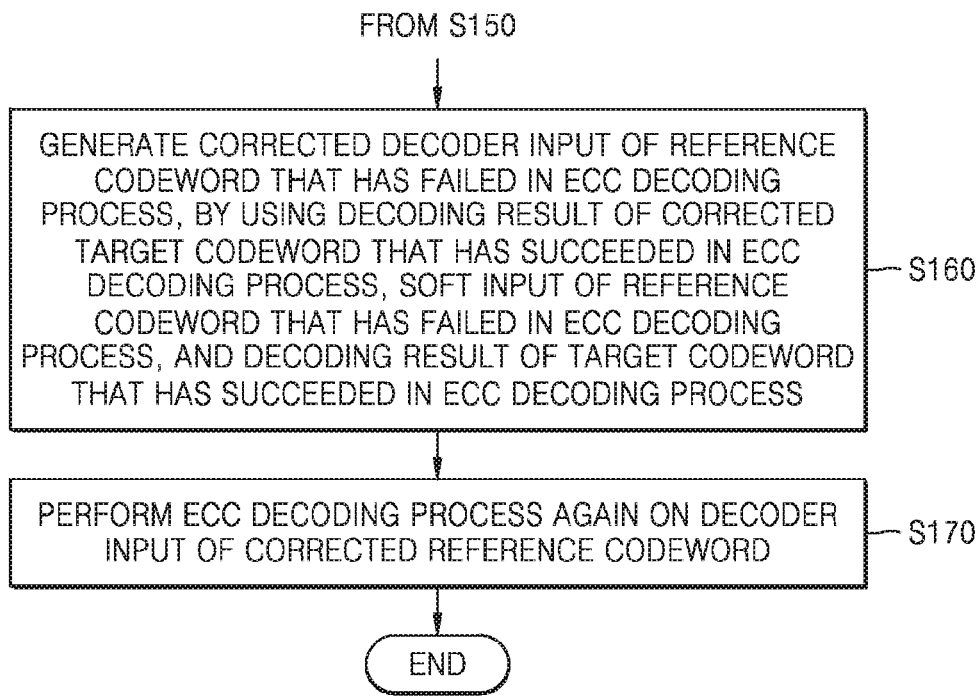
FIG. 34 is a flowchart showing operations that may be added to the flowchart of FIG. 27.

FIG. 34 is a flowchart showing operations that may be added to the flowchart of FIG. 27.

After completing Operation S150, the system generates a corrected decoder input of a reference codeword that has failed in an ECC decoding process, based on an operation process according to code correlation by using a decoding result of a corrected target codeword that has succeeded in the ECC decoding process, a soft input of a reference codeword that has failed in the ECC decoding process, and a decoding result of a target codeword that has succeeded in the ECC decoding process (Operation S160). For example, a corrected decoder input of a reference codeword that has failed in an ECC decoding process may be generated in a manner as described with reference to FIG. 22B.

Next, the system performs an ECC decoding process again on the decoder input of the corrected reference codeword (Operation S170). Accordingly, a recovery process for a reference codeword that has failed in an ECC decoding process may be performed again by using the decoder input of the corrected reference codeword.

Figure 35:
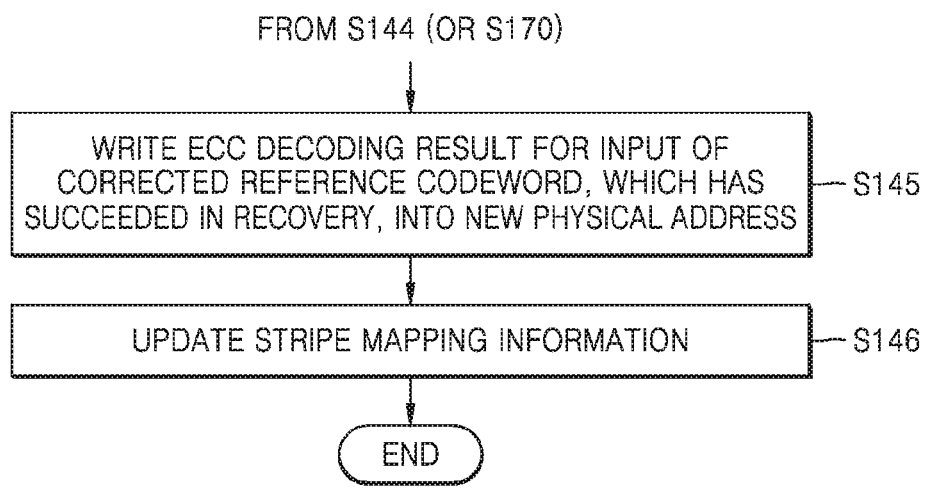
FIG. 35 is a flowchart showing operations that may be added to the flowchart of FIG. 33 or FIG. 34.

FIG. 35 is a flowchart showing operations that may be added to the flowchart of FIG. 33 or FIG. 34.

After completing Operation S144 or S170, the system writes an ECC decoding result for an input of a corrected reference codeword, which has succeeded in a recovery, into a new physical address (Operation S145).

Next, the system updates stripe mapping information based on the new physical address into which the ECC decoding result has been written (Operation S146).

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. A method of recovering data, the method comprising:
   reading reference codewords, which have a code correlation with a target codeword, from a memory device when an error-correcting code (ECC) decoding process for a decoder input of the target codeword has failed;
   generating a decoder input of a corrected target codeword, based on an operation process using the target codeword and the reference codewords; and
   performing the ECC decoding process again on the decoder input of the corrected target codeword,
   wherein:
   the reference codewords are read from a storage region which forms a same stripe as the target codeword, and
   the reference codewords correspond to at least one vertical codeword which is not satisfying an even parity.

2. The method of claim 1, wherein the generating of the decoder input of the corrected target codeword comprises:
   performing the ECC decoding process on each of the reference codewords; and
   correcting the decoder input of the target codeword, based on the operation process according to the code correlation, by using a decoding result of a reference codeword that has succeeded in the ECC decoding process, a soft input of a reference codeword that has failed in the ECC decoding process, and a soft input of the target codeword that has failed in the ECC decoding process.

3. The method of claim 2, further comprising correcting the decoder input of the target codeword when the ECC decoding process for at least one of the reference codewords has failed, and recovering the target codeword by using decoding results of the reference codewords when the ECC decoding process for all of the reference codewords succeeds.

4. The method of claim 2, wherein the soft input of each of the reference codeword and the target codeword that have failed in the ECC decoding process comprises code bits including a sign bit and a reliability bit in memory cell units, wherein the sign bit and the reliability bit are read from the memory device according to a soft decision read operation.

5. The method of claim 2, wherein the correcting of the decoder input of the target codeword comprises:
   detecting a candidate codeword, which does not satisfy a code constraint condition, from a code matrix including the decoding result of the reference codeword that has succeeded in the ECC decoding process, the soft input of the reference codeword that has failed in the ECC decoding process, and the soft input of the target codeword that has failed in the ECC decoding process; and
   correcting the soft input of the target codeword, based on a reliability of code bits included in the candidate codeword.

6. The method of claim 5, further comprising changing a reliability of the soft input of the target codeword based on a reliability of a codeword that satisfies the code constraint condition in the code matrix.

7. The method of claim 5, wherein the code matrix is configured based on a multi-dimensional code.

8. The method of claim 5, wherein the detecting of the candidate codeword comprises:
arranging the decoding result of the reference codeword that has succeeded in the ECC decoding process, the soft input of the reference codeword that has failed in the ECC decoding process, and the soft input of a target codeword that has failed in the ECC decoding process as codewords in a first direction of the code matrix and
determining, as the candidate codeword, a codeword in a second direction of the code matrix in which an error due to a parity check for the second direction of the code matrix occurs.

9. The method of claim 8, wherein the correcting of the soft input of the target codeword further comprises:
comparing items of reliability of code bits in candidate codeword units;
detecting an error candidate code bit having a lowest reliability in the candidate codeword units, based on a result of the comparing; and
correcting an error candidate code bit included in the soft input of the target codeword.

10. The method of claim 9, wherein the correcting of the error candidate code bit comprises inverting a sign bit of an error candidate code bit included in the target codeword.

11. The method of claim 9, wherein:
the correcting of the soft input of the target codeword comprises performing an operation of detecting the error candidate code bit having the lowest reliability in the candidate codeword units in the second direction of the code matrix and inverting a sign bit of the error candidate code bit included in the soft input of the target codeword in the first direction of the code matrix, and
the decoding result of the reference codeword that has succeeded in the ECC decoding process, the soft input of the reference codeword that has failed in the ECC decoding process, and the soft input of the target codeword that has failed in the ECC decoding process are arranged as the codewords in the first direction of the code matrix, and candidate codewords are determined as codewords in the second direction of the code matrix, in which an error due to a parity check for the second direction of the code matrix occurs.

12. The method of claim 9, wherein the candidate codeword does not have a plurality of code bits having the lowest reliability.

13. The method of claim 2, further comprising:
generating a decoder input of a corrected reference codeword for the reference codeword that has failed in the ECC decoding process, based on the operation process according to the code correlation by using the decoding result of the reference codeword that has succeeded in the ECC decoding process, the soft input of the reference codeword that has failed in the ECC decoding process, and the soft input of the target codeword that has failed in the ECC decoding process; and
performing the ECC decoding process again on the decoder input of the corrected reference codeword.

14. The method of claim 1, further comprising:
when the ECC decoding process performed again on the decoder input of the corrected target codeword succeeds in data recovery, generating a decoder input of a corrected reference codeword for a reference codeword that has failed in the ECC decoding process, based on the operation process according to the code correlation which uses a decoding result of the corrected target codeword that has succeeded in the ECC decoding process, a decoding result of a reference codeword that has succeeded in the ECC decoding process, and a soft input of a reference codeword that has failed in the ECC decoding process; and
performing the ECC decoding process again on the decoder input of the corrected reference codeword.

15. The method of claim 1, further comprising:
when the decoder input of the corrected target codeword comprises a first soft input and the ECC decoding process performed again on the decoder input of the corrected target codeword fails in data recovery, acquiring a second soft input of the target codeword, based on a soft decision read operation of generating a reliability bit indicating a reliability level more subdivided than the first soft input; and
performing the ECC decoding for a recovery process on the target codeword, based on the second soft input of the target codeword.

16. The method of claim 1, further comprising:
writing an ECC decoding result for the decoder input of the corrected target codeword into a new physical address of the memory device when the ECC decoding process for the decoder input of the corrected target codeword has succeeded, wherein
stripe mapping information is updated based on the new physical address into which the ECC decoding result for the decoder input has been written.

17. The method of claim 1, wherein the ECC decoding process comprises a decoding process using a low density parity check (LDPC) code, a Bose-Chaudhuri-Hocquenghem (BCH) code, a turbo code, or a convolution code.

18. A redundant array of inexpensive disks (RAID) storage system comprising:
a plurality of storage devices; and
a RAID controller configured to:
correct a soft input of a codeword that has failed in an error-correcting code (ECC) decoding process, based on an operation process according to a code correlation by using soft inputs received from storage devices that have failed in the ECC decoding process and decoding results received from storage devices that have succeeded in the ECC decoding process, when the ECC decoding process for codewords read from two or more storage devices forming a same stripe from among the plurality of storage devices fails, and
perform the ECC decoding process on the corrected soft input of the codeword, wherein:
the soft inputs are of reference codewords read from a storage region which forms the same stripe as the codeword, and
the reference codewords correspond to at least one vertical codeword which is not satisfying an even parity.

19. A memory system comprising:
a nonvolatile memory system; and
a memory controller that:
executes a soft read of a target code word stored by the nonvolatile memory system that cannot be properly decoded by applying error-correction code (ECC) decoding,
executes a soft read of a first reference code word stored by the nonvolatile memory system that cannot be properly decoded by applying the ECC decoding,
identifies a candidate code word that does not satisfy a code constraint, the candidate code word comprising data from each of the soft read of the target code word, the soft read of the first reference code word, and a second reference code word that can be properly decoded by applying the ECC decoding, changes a data value attributed to a data unit within the soft read of the target code word, so that the candidate code word satisfies the code constraint, and thereby creating a revised soft read of the target code word, and applies the ECC decoding to the revised soft read of the target code word, wherein the code constraint corresponds to an even parity.

20. The memory system of claim 19, wherein the first reference code word is read from a storage region which forms a same stripe as the target code word.

* * * * *